(12) United States Patent
Izawa

(10) Patent No.: US 10,192,793 B2
(45) Date of Patent: Jan. 29, 2019

(54) PATTERN FORMATION METHOD, IMPRINT DEVICE, AND COMPUTER-READABLE NON-VOLATILE STORAGE MEDIUM STORING DROP RECIPE ADJUSTMENT PROGRAM

(71) Applicant: Toshiba Memory Corporation, Minato-ku (JP)

(72) Inventor: Yusaku Izawa, Yokkaichi (JP)

(73) Assignee: Toshiba Memory Corporation, Minato-ku (JP)

( * ) Notice: Subject to any disclaimer, the term of this patent is extended or adjusted under 35 U.S.C. 154(b) by 0 days.

(21) Appl. No.: 15/698,801

(22) Filed: Sep. 8, 2017

(65) Prior Publication Data
US 2018/0218951 A1    Aug. 2, 2018

(30) Foreign Application Priority Data

Jan. 27, 2017 (JP) ................................. 2017-012789

(51) Int. Cl.
| | |
|---|---|
| *H01L 21/66* | (2006.01) |
| *H01L 21/311* | (2006.01) |
| *H01L 27/11568* | (2017.01) |
| *H01L 27/11573* | (2017.01) |
| *H01L 21/67* | (2006.01) |
| *H01L 21/027* | (2006.01) |
| *G03F 7/00* | (2006.01) |
| *H01L 21/687* | (2006.01) |
| *H01L 27/11582* | (2017.01) |

(52) U.S. Cl.
CPC ............ *H01L 22/20* (2013.01); *G03F 7/0002* (2013.01); *H01L 21/0271* (2013.01); *H01L 21/31144* (2013.01); *H01L 21/67092* (2013.01); *H01L 21/67253* (2013.01); *H01L 27/11568* (2013.01); *H01L 27/11573* (2013.01); *H01L 21/68714* (2013.01); *H01L 27/11582* (2013.01)

(58) Field of Classification Search
CPC ..................... H01L 22/34; H01L 22/30; H01L 2223/54486; H01L 23/544; H01L 2223/54433; H01L 2224/4809; H01L 2224/48247; H01L 2224/48465
See application file for complete search history.

(56) References Cited

U.S. PATENT DOCUMENTS

| | | | |
|---|---|---|---|
| 8,420,422 B2 | 4/2013 | Asano et al. | |
| 2011/0229988 A1* | 9/2011 | Asano ................... | B82Y 10/00 438/7 |

(Continued)

FOREIGN PATENT DOCUMENTS

| | | |
|---|---|---|
| JP | 5238742 | 7/2013 |
| JP | 2014-175434 | 9/2014 |

(Continued)

*Primary Examiner* — Su C Kim
(74) *Attorney, Agent, or Firm* — Oblon, McClelland, Maier & Neustadt, L.L.P.

(57) ABSTRACT

According to one embodiment, a pattern formation method includes correcting, based on a relationship between a residual film thickness of an imprint pattern and a dimension of an etching pattern that is formed using an imprint pattern as a mask, the residual film thickness of the imprint pattern; and using the imprint pattern with the corrected residual film thickness as a mask to form an etching pattern with the corrected dimension.

14 Claims, 16 Drawing Sheets

(56) References Cited

U.S. PATENT DOCUMENTS

2015/0234287 A1    8/2015   Tanaka
2016/0067965 A1    3/2016   Kinoshita et al.
2018/0059537 A1*   3/2018   Jung .................... G03F 7/0002

FOREIGN PATENT DOCUMENTS

JP       2015-153953     8/2015
JP       2016-58476      4/2016

* cited by examiner

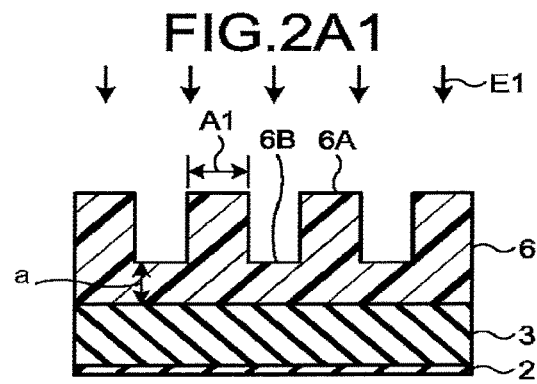
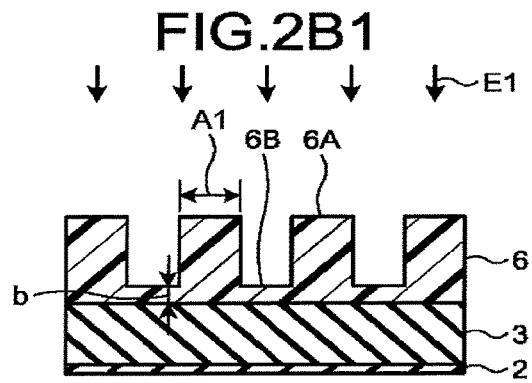
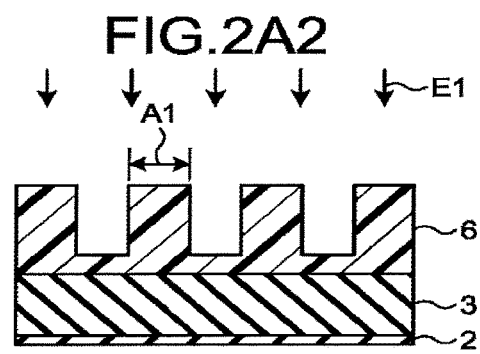
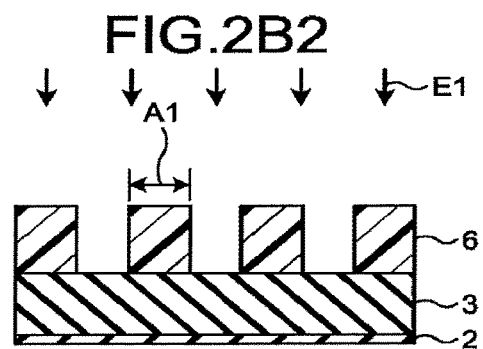
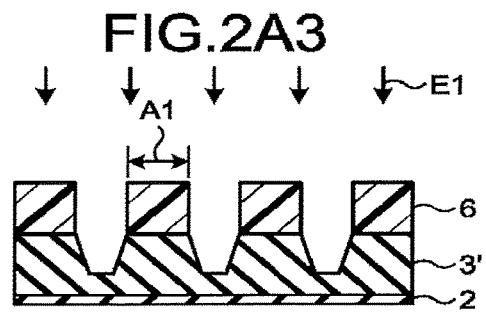
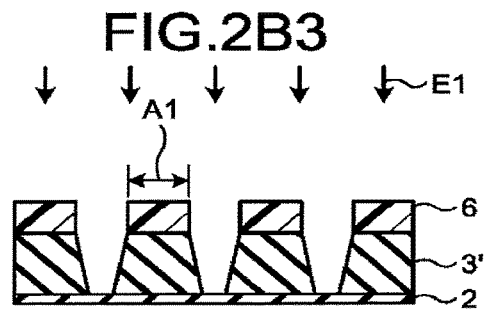
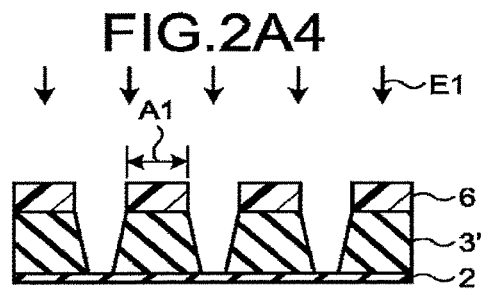
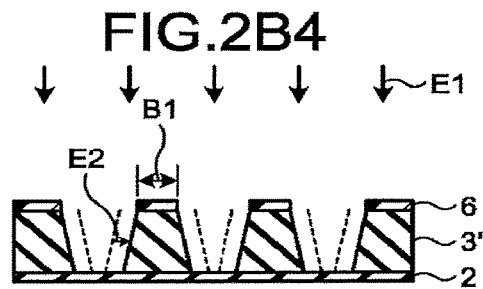
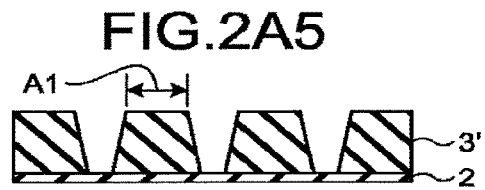
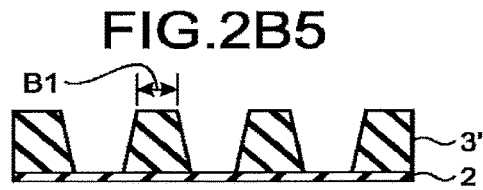

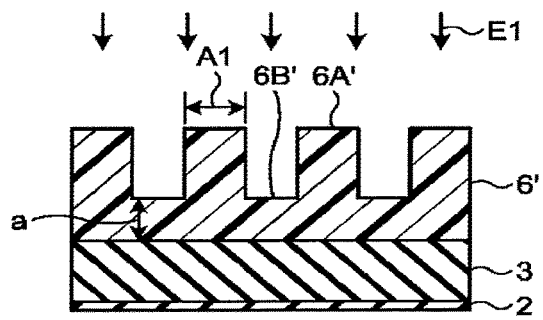
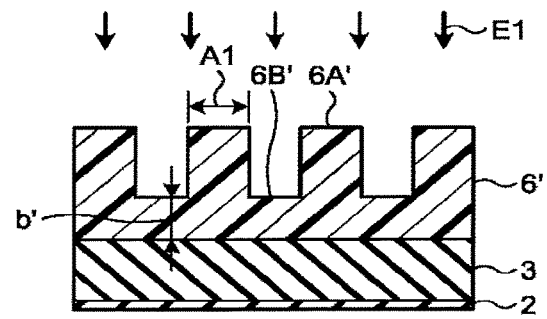
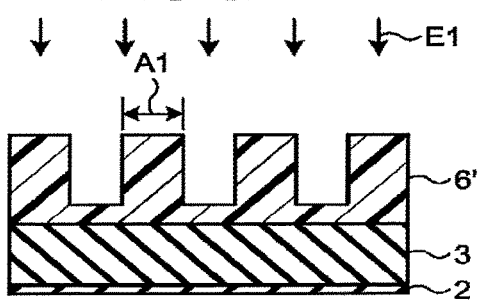
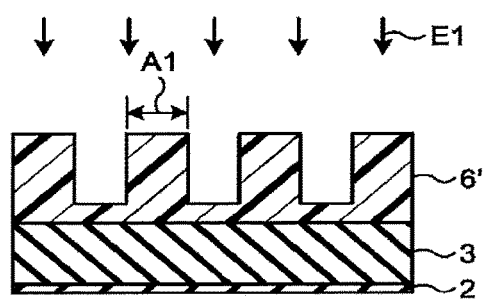
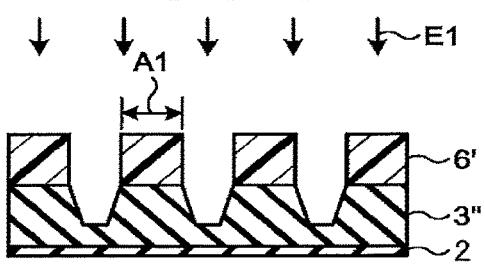
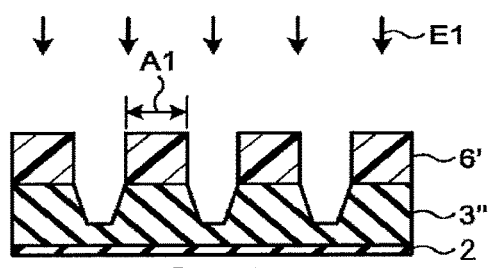
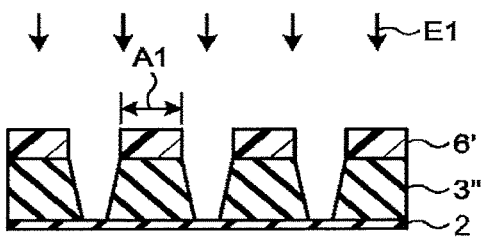
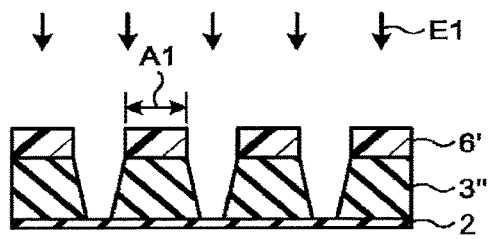
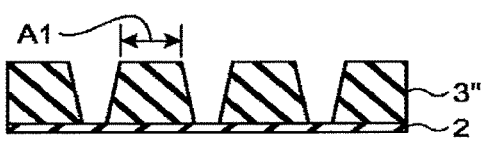
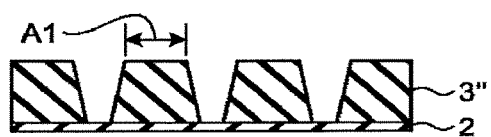

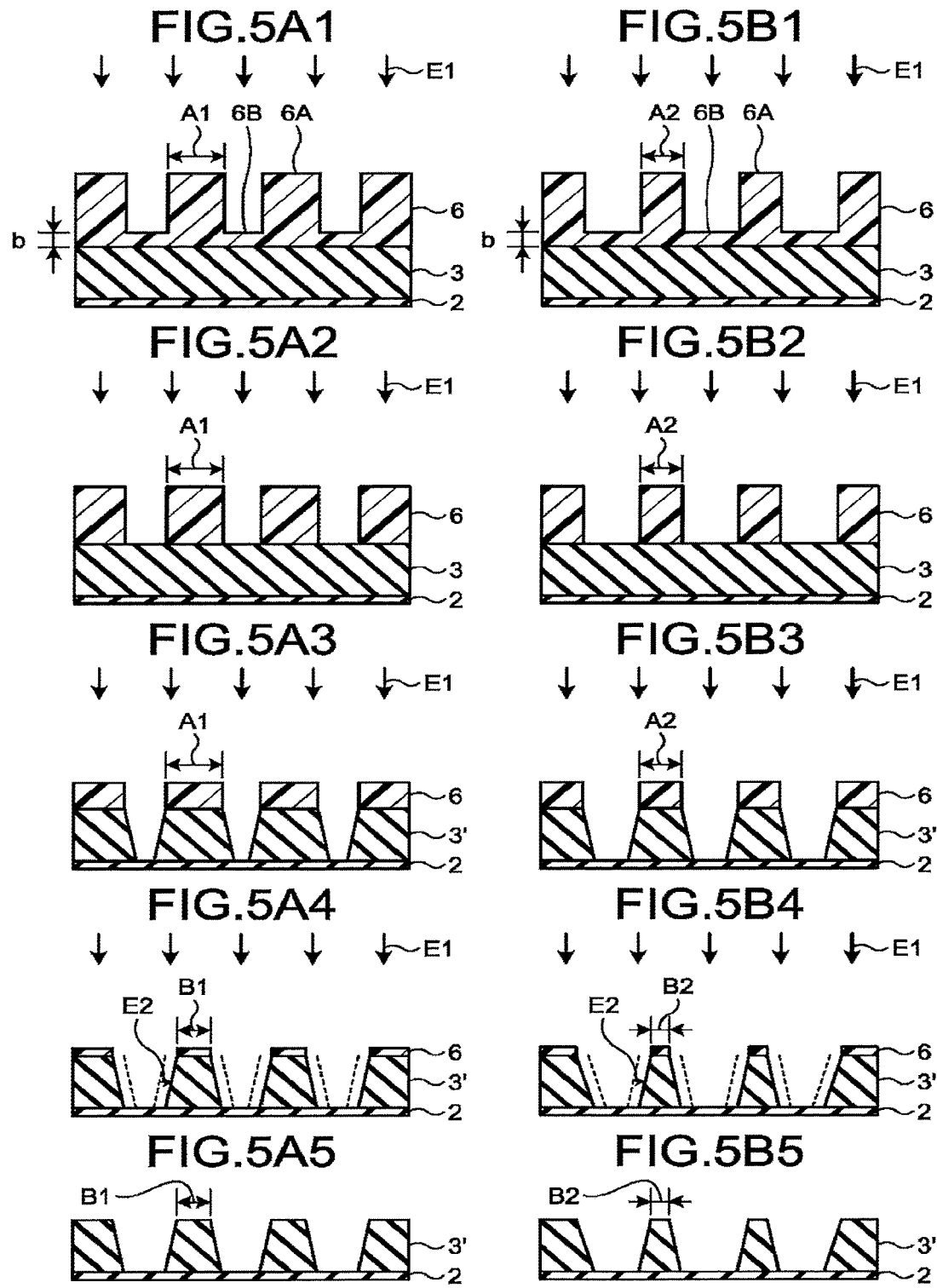

FIG.6A1
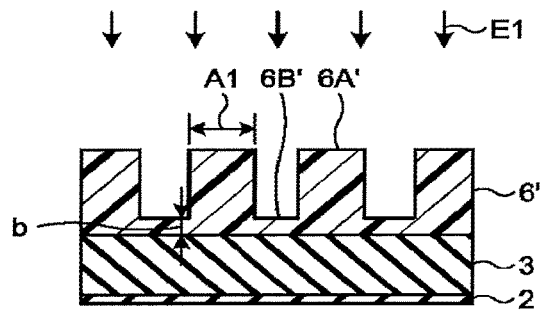
FIG.6B1
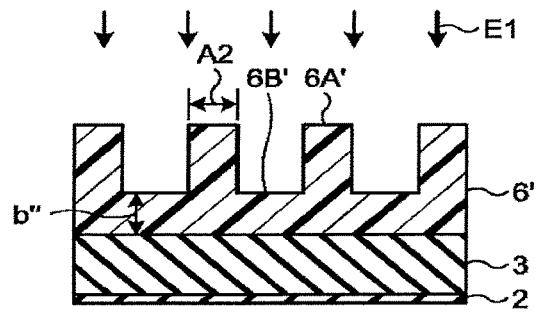
FIG.6A2
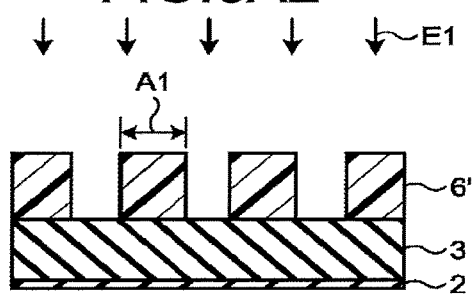
FIG.6B2
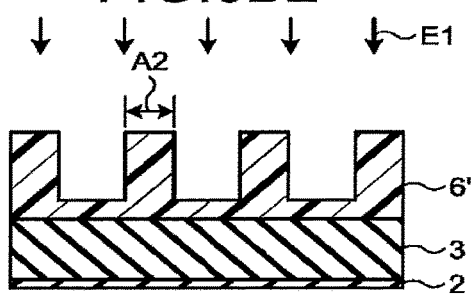
FIG.6A3
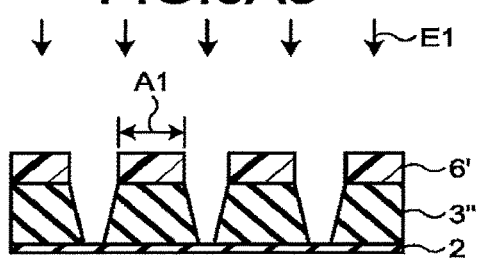
FIG.6B3
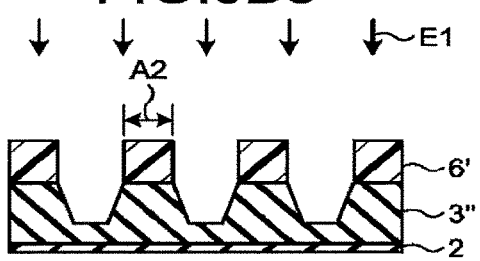
FIG.6A4
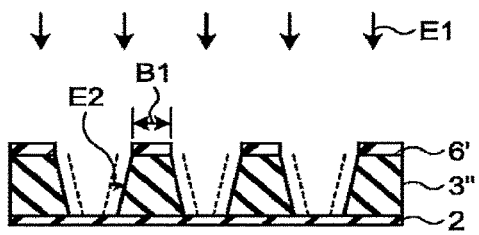
FIG.6B4
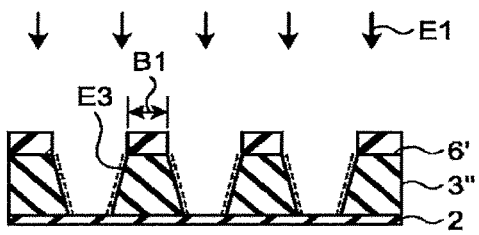
FIG.6A5
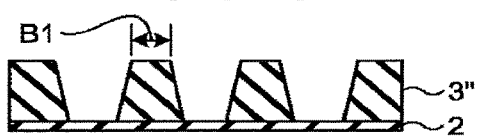
FIG.6B5
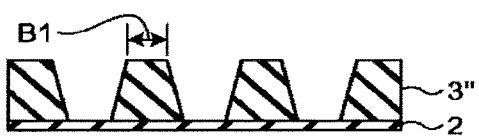

FIG.10A
FIG.10B
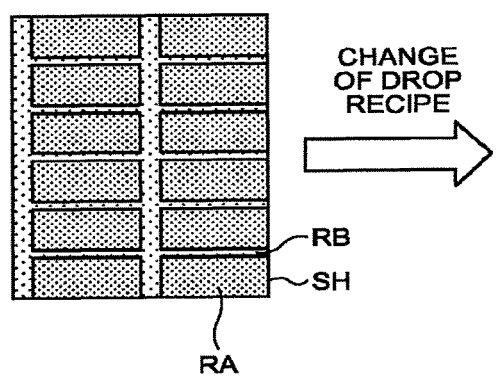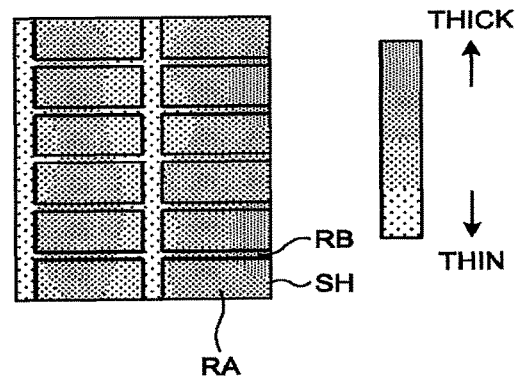
FIG.11A
FIG.11B
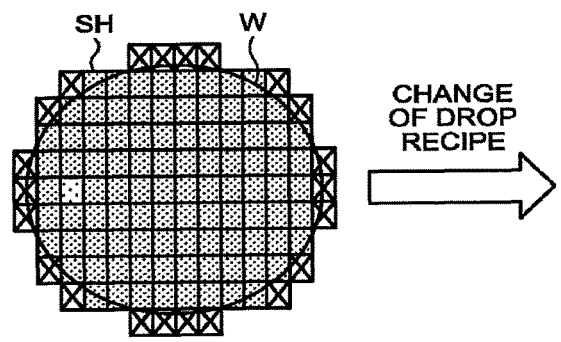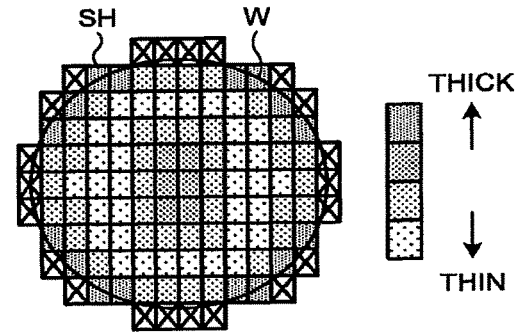

PATTERN FORMATION METHOD, IMPRINT DEVICE, AND COMPUTER-READABLE NON-VOLATILE STORAGE MEDIUM STORING DROP RECIPE ADJUSTMENT PROGRAM

CROSS-REFERENCE TO RELATED APPLICATIONS

This application is based upon and claims the benefit of priority from Japanese Patent Application No. 2017-012789, filed on Jan. 27, 2017; the entire contents of which are incorporated herein by reference.

FIELD

Embodiments described herein relate generally to a pattern formation method, an imprint device, and a computer-readable non-volatile storage medium storing a drop recipe adjustment program.

BACKGROUND

With finer semiconductor devices, imprint lithography may be used rather than photolithography due to lower costs. In imprint lithography, an imprint material is dropped and a template is pressed against the imprint material to transfer a template pattern onto the imprint material.

BRIEF DESCRIPTION OF THE DRAWINGS

FIGS. 2A1 to 2A5 are cross-sectional views illustrating a formation method of an etching pattern 3' in a peripheral region R2 illustrated in FIG. 1B, and FIGS. 2B1 to 2B5 are cross-sectional views illustrating a formation method of the etching pattern 3' in a cell region R3 illustrated in FIG. 1B;

FIGS. 3A1 to 3A5 are cross-sectional views illustrating a formation method of the etching pattern 3' in the peripheral region R2 illustrated in FIG. 1D, and FIGS. 3B1 to 3B5 are cross-sectional views illustrating a formation method of the etching pattern 3' in the cell region R3 illustrated in FIG. 1D;

FIGS. 5A1 to 5A5 are cross-sectional views illustrating a formation method of the etching pattern 3' in a portion with a pattern width A1 of an imprint pattern 6 illustrated in FIG. 4B, and FIGS. 5B1 to 5B5 are cross-sectional views illustrating a formation method of the etching pattern 3' in a portion with a pattern width A2 of the imprint pattern 6 illustrated in FIG. 4B;

FIGS. 6A1 to 6A5 are cross-sectional views illustrating a formation method of an etching pattern 3" in a portion with a pattern width A1 of an imprint pattern 6' illustrated in FIG. 4D, and FIGS. 6B1 to 6B5 are cross-sectional views illustrating a formation method of the etching pattern 3" in a portion with a pattern width A2 of the imprint pattern 6' illustrated in FIG. 4D;

FIG. 10A is a plane view of an example of drop density distribution before the change of a drop recipe calculable by the pattern formation system illustrated in FIG. 9, and FIG. 10B is a plane view of an example of drop density distribution after the change of the drop recipe calculable by the pattern formation system illustrated in FIG. 9;

FIG. 11A is a plane view of another example of drop density distribution before the change of a drop recipe calculable by the pattern formation system illustrated in FIG. 9, and FIG. 11B is a plane view of another example of drop density distribution after the change of the drop recipe calculable by the pattern formation system illustrated in FIG. 9;

DETAILED DESCRIPTION

In general, according to one embodiment, a pattern formation method includes correcting, based on a relationship between a residual film thickness of an imprint pattern and a dimension of an etching pattern that is formed using an imprint pattern as a mask, the residual film thickness of the imprint pattern; and using the imprint pattern with the corrected residual film thickness as a mask to form an etching pattern with the corrected dimension.

Exemplary embodiments of a pattern formation method and an imprint device will be explained below in detail with reference to the accompanying drawings. The present invention is not limited to the following embodiments.

First Embodiment

Figure 1A:
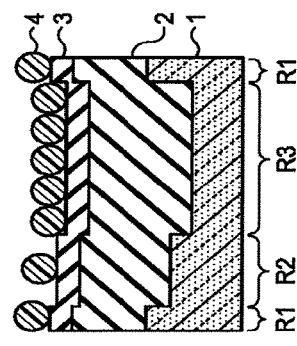
FIG. 1A is a cross-sectional view of an example of drop density distribution before the change of a drop recipe according to a first embodiment.
Figure 1C:
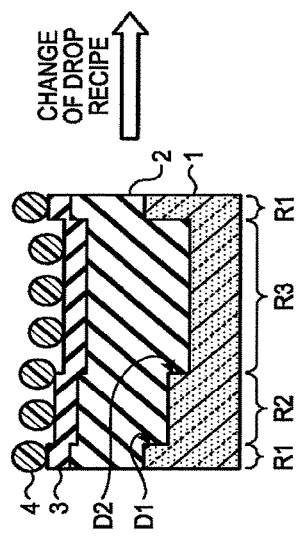
FIG. 1C is a cross-sectional view of an example of drop density distribution after the change of the drop recipe according to the first embodiment.
Figure 1B:
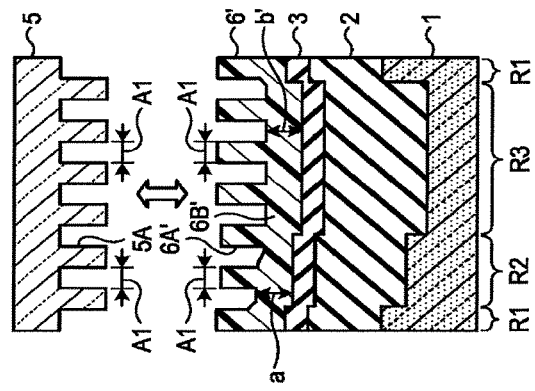
FIG. 1B is a cross-sectional view of an example of a resist residual film thickness of an imprint pattern before the change of the drop recipe according to the first embodiment.
Figure 1D:
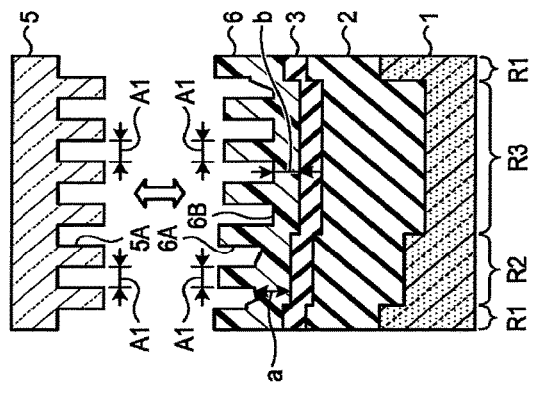
FIG. 1D is a cross-sectional view of an example of the resist residual film thickness of the imprint pattern after the change of the drop recipe according to the first embodiment.

FIG. 1A is a cross-sectional view of an example of drop density distribution before the change of a drop recipe according to a first embodiment, FIG. 1B is a cross-sectional view of an example of a resist residual film thickness of an imprint pattern before the change of the drop recipe according to the first embodiment, FIG. 1C is a cross-sectional view of an example of drop density distribution after the change of the drop recipe according to the first embodiment, and FIG. 1D is a cross-sectional view of an example of the resist residual film thickness of the imprint pattern after the change of the drop recipe according to the first embodiment.

Referring to FIG. 1A, insulation layers 2 and 3 are stacked in sequence on a semiconductor layer 1. The semiconductor layer 1 can have a kerf region R1, a peripheral region R2, and a cell region R3. Memory cells can be arranged in the cell region R3. Row decoders, sense amplifiers, and the like for operating the memory cells can be arranged in the peripheral region R2. Alignment marks, test element groups (TEG), and the like can be arranged in the kerf region R1. The kerf region R1 can be used as a scribe region where the semiconductor layer 1 is cut in chip form. A level difference D1 can be provided between the kerf region R1 and the peripheral region R2. A level difference D2 can be provided between the peripheral region R2 and the cell region R3. The material for the semiconductor layer 1 can be amorphous silicon, for example. The material for the insulation layer 2 can be spin on carbon (SOC), for example. The material for the insulation layer 3 can be spin on glass (SOG), for example.

Then, an imprint material 4 is dropped onto the insulation layer 3. To drop the imprint material 4, the imprint material 4 may be discharged by an ink-jet method onto the insulation layer 3. In this case, the imprint material 4 can be discretely arranged in drops on the insulation layer 3. That is, the drops of the imprint material 4 can be arranged two-dimensionally so as not to overlap one above the other. The drops of the imprint material 4 can be equal in diameter. Accordingly, varying the drop density of the imprint material 4 on the insulation layer 3 can change the spacing between the drops of the imprint material 4 on the insulation layer 3.

The material for the imprint material 4 can be a resist material, for example. The resist material can be an ultraviolet curable resin, for example. In the case of using a resist material for the imprint material 4, the insulation layers 2 and 3 can be used as hard mask materials.

Referring to FIG. 1B, a template 5 has recessed portions 5A. The width of the recessed portions 5A can be set to A1. The width A1 can be set to a value of the order of nanometer. The material for the template 5 can be quartz, for example.

Then, the template 5 is pressed against the imprint material 4. Then, while the template 5 is pressed against the imprint material 4, the imprint material 4 is irradiated with ultraviolet rays to cure the imprint material 4. After the curing of the imprint material 4, the template 5 is separated from the imprint material 4 to form an imprint pattern 6 on the insulation layer 3. In this case, projecting portions 6A can be formed in the imprint pattern 6 in correspondence with the shape of the recessed portions 5A. The width of the projecting portions 6A can be set to A1. The imprint pattern 6 also has a residual film 6B formed thereon. The thickness of the residual film 6B varies depending on the level-difference portions D1 and D2. For example, the residual film thickness of the residual film 6B is "a" in the peripheral region R2, and the residual film thickness of the residual film 6B is b (b<a) in the cell region R3. When the resist is used as the imprint material 4, the residual film thickness may be called residual layer thickness (RLT).

FIGS. 2A1 to 2A5 are cross-sectional views illustrating a formation method of an etching pattern 3' in the peripheral region R2 illustrated in FIG. 1B, and FIGS. 2B1 to 2B5 are cross-sectional views illustrating a formation method of the etching pattern 3' in the cell region R3 illustrated in FIG. 1B. FIG. 2A1 is obtained by cutting out the insulation layers 2 and 3 and the imprint pattern 6 in the peripheral region R2 illustrated in FIG. 1B, and FIG. 2B1 is obtained by cutting out the insulation layers 2 and 3 and the imprint pattern 6 in the cell region R3 illustrated in FIG. 1B.

Referring to FIGS. 2A1 and 2B1, the residual film thickness of the residual film 6B is "a" in the peripheral region R2, and the residual film thickness of the residual film 6B is b in the cell region R3.

Next, as illustrated in FIGS. 2A1 to 2A4 and 2B1 to 2B4, the insulation layer 3 is subjected to etching E1 using the imprint pattern 6 as a mask to form the etching pattern 3' on the insulation layer 2. The shape of the etching pattern 3' may have recesses and projections, lines and spaces, halls, pillars, or the like without particular limitation.

In this case, as illustrated in FIGS. 2A1 and 2B1, the residual film thickness "a" in the peripheral region R2 is larger than the residual film thickness b in the cell region R3. Accordingly, as illustrated in FIGS. 2A2 and 2B2, even when the residual film 6B is removed from the insulation layer 3 in the cell region R3, the residual film 6B remains on the insulation layer 3 in the peripheral region R2.

As a result, the etching E1 on the insulation layer 3 in the cell region R3 is started earlier than the etching E1 on the insulation layer 3 in the peripheral region R2. Therefore, as illustrated in FIGS. 2A3 and 2B3, the etching pattern 3' penetrates the insulation layer 3 in the cell region R3 before the etching pattern 3' penetrates the insulation layer 3 in the peripheral region R2.

Then, as illustrated in FIGS. 2A4 and 2B4, when the etching pattern 3' penetrates the insulation layer 3 in the peripheral region R2, side etching E2 of the etching pattern 3' proceeds in the cell region R3. Accordingly, when the width of the etching pattern 3' in the peripheral region R2 is A1, the width of the etching pattern 3' in the cell region R3 is B1 (B1<A1). Therefore, even when the etching E1 is performed in the peripheral region R2 and the cell region R3 at the same time, the width of the etching pattern 3' varies between the peripheral region R2 and the cell region R3.

Next, as illustrated in FIGS. 2A5 and 2B5, after the etching E1, the residual imprint pattern 6 is removed from the etching pattern 3'.

When the difference between the width A1 of the etching pattern 3' in the peripheral region R2 and the width B1 of the etching pattern 3' in the cell region R3 does not fall within a prescribed range, a drop recipe of the imprint material 4 can be changed as illustrated in FIG. 1C. At the change of the drop recipe, the difference between the width A1 of the etching pattern 3' in the peripheral region R2 and the width B1 of the etching pattern 3' in the cell region R3 can be reduced. To reduce the difference between the width A1 of the etching pattern 3' in the peripheral region R2 and the width B1 of the etching pattern 3' in the cell region R3, the width of the etching pattern 3' in the cell region R3 is made larger than B1. To make the width of the etching pattern 3' in the cell region R3 larger than B1, the residual film thickness of the residual film 6B in the cell region R3 is made larger than b. To make the residual film thickness of the residual film 6B in the cell region R3 larger than b, the drop density of the imprint material 4 in the cell region R3 is increased. To increase the drop density of the imprint material 4 in the cell region R3, the spacing between the drops of the imprint material 4 in the cell region R3 in FIG. 1C is smaller than that in FIG. 1A.

Next, as illustrated in FIG. 1D, the template 5 is pressed against the imprint material 4. Then, while the template 5 is pressed against the imprint material 4, the imprint material 4 is irradiated with ultraviolet rays to cure the imprint material 4. After the curing of the imprint material 4, the template 5 is separated from the imprint material 4 to form an imprint pattern 6' on the insulation layer 3. In this case, projecting portions 6A' can be formed in the imprint pattern 6' in correspondence with the shape of the recessed portions 5A. The width of the projecting portions 6A' can be set to A1. The imprint pattern 6' also has a residual film 6B' formed thereon. In this case, the residual film thickness of the residual film 6B' is "a" in the peripheral region R2, and the residual film thickness of the residual film 6B' is b' (b<b') in the cell region R3.

To change the drop recipe, the relationship between the residual film thickness of the imprint pattern 6 and the width of the etching pattern 3' can be referred to. In this case, the condition that the width of the projecting portions 6A in the imprint pattern 6 is uniform can be set up. The residual film thickness of the imprint pattern 6 can be set to a plurality of different values. Then, the widths of the etching pattern 3' can be determined respectively corresponding to the plurality of different values of the residual film thickness. From the relationship between the plurality of different values of the residual film thickness and the widths of the etching pattern 3' respectively corresponding to the values, the change rate of the width of the etching pattern 3' with respect to the residual film thickness of the imprint pattern 6 can be calculated. In this case, the change rate may be expressed linearly based on the assumption that the change rate of the width of the etching pattern 3' with respect to the residual film thickness of the imprint pattern 6 is uniform. Then, the residual film thickness of the imprint pattern 6 can be corrected according to the change rate to reduce the variations in the width of the etching pattern 3'. To correct the residual film thickness of the imprint pattern 6, the drop density of the imprint material 4 corresponding to the residual film thickness of the imprint pattern 6 is calculated. Then, the imprint material 4 can be dropped onto the insulation layer 3 based on the calculated drop density.

The residual film thickness of the imprint pattern 6 and the width of the etching pattern 3' can be determined by actual measurement. The residual film thickness of the imprint pattern 6 can be determined by actual measurement using an ellipsometer, a scatterometry, or the like. The width of the etching pattern 3' can be determined by actual measurement using length measurement scanning electron microscope (SEM) or the like. The relationship between the residual film thickness of the imprint pattern 6 and the width of the etching pattern 3' may be determined by simulation.

To determine the relationship between the plurality of different values of the residual film thickness of the imprint pattern 6 and the widths of the etching pattern 3' respectively corresponding to the values, the width of the etching pattern 3' can be determined in each of areas different in the residual film thickness of the imprint pattern 6. In this case, a plurality of samples assigned with different residual film thicknesses of the imprint pattern 6 may be prepared as necessary. Alternatively, a TEG for determining the relationship between the residual film thickness of the imprint pattern 6 and the width of the etching pattern 3' may be provided in the kerf region R1, so that different residual film thicknesses of the imprint pattern 6 are assigned in the TEG.

The drop recipe may be changed in each of the areas different in the residual film thickness of the imprint pattern 6, may be changed at each of pattern positions with the width of the etching pattern 3' different from the target value, may be changed at each shot at the time of imprint, may be changed between wafers, or may be changed between lots.

FIGS. 3A1 to 3A5 are cross-sectional views illustrating a formation method of the etching pattern 3" in the peripheral region R2 illustrated in FIG. 1D, and FIGS. 3B1 to 3B5 are cross-sectional views illustrating a formation method of the etching pattern 3" in the cell region R3 illustrated in FIG. 1D. FIG. 3A1 is obtained by cutting out the insulation layers 2 and 3 and the imprint pattern 6' in the peripheral region R2 illustrated in FIG. 1D, and FIG. 3B1 is obtained by cutting out the insulation layers 2 and 3 and the imprint pattern 6' in the cell region R3 illustrated in FIG. 1D.

Referring to FIGS. 3A1 and 3B1, the residual film thickness of the residual film 6B' is "a" in the peripheral region R2, and the residual film thickness of the residual film 6B' is b' in the cell region R3.

Next, as illustrated in FIGS. 3A1 to 3A4 and 3B1 to 3B4, the insulation layer 3 is subjected to the etching E1 using the imprint pattern 6' as a mask to form the etching pattern 3" on the insulation layer 2.

Next, as illustrated in FIGS. 3A1 and 3B1, the residual film thickness "a" in the peripheral region R2 can be equal to the residual film thickness b' in the cell region R3. Accordingly, as illustrated in FIGS. 3A2 and 3B2, when the residual film 6B' remains on the insulation layer 3 in the cell region R3, the residual film 6B' can be left on the insulation layer 3 in the peripheral region R2.

As a result, the etching E1 on the insulation layer 3 in the cell region R3 can be started at the same time as the etching E1 on the insulation layer 3 in the peripheral region R2. Therefore, as illustrated in FIGS. 3A3 and 3B3, the etching E1 on the insulation layer 3 can be performed while keeping the depth of the etching pattern 3" in the peripheral region R2 equal to the depth of the etching pattern 3" in the cell region R3.

In addition, as illustrated in FIGS. 3A4 and 3B4, when the etching pattern 3" penetrates the insulation layer 3 in the peripheral region R2, the etching pattern 3" can penetrate the insulation layer 3 in the cell region R3. Accordingly, when the width of the etching pattern 3" in the peripheral region R2 is A1, the width of the etching pattern 3" in the cell region R3 can be set to A1. Accordingly, even when the etching E1 is performed in the peripheral region R2 and the cell region R3 at the same time, it is possible to prevent variations in the width of the etching pattern 3" between the peripheral region R2 and the cell region R3.

Next, as illustrated in FIGS. 3A5 and 3B5, after the etching E1, the residual imprint pattern 6' is removed from the etching pattern 3".

Figure 4A:
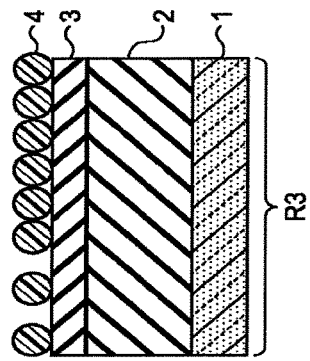
FIG. 4A is a cross-sectional view of another example of drop density distribution before the change of a drop recipe according to the first embodiment.
Figure 4C:
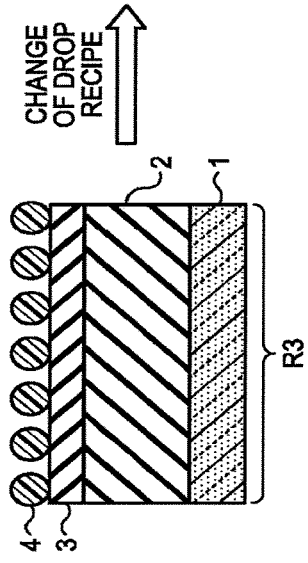
FIG. 4C is a cross-sectional view of another example of drop density distribution after the change of the drop recipe according to the first embodiment.
Figure 4B:
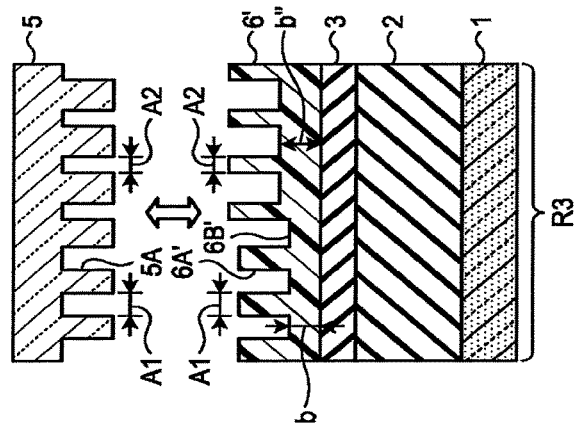
FIG. 4B is a cross-sectional view of another example of a resist residual film thickness of an imprint pattern before the change of the drop recipe according to the first embodiment.
Figure 4D:
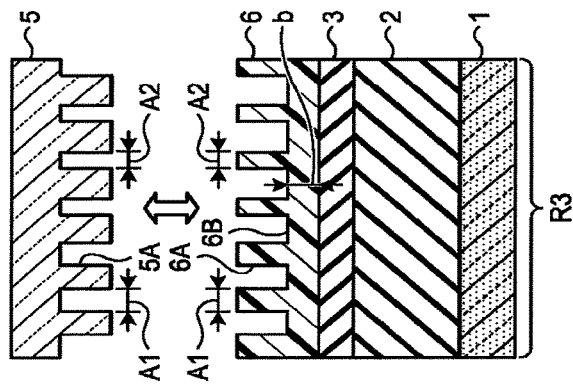
FIG. 4D is a cross-sectional view of another example of the resist residual film thickness of the imprint pattern after the change of the drop recipe according to the first embodiment.

FIG. 4A is a cross-sectional view of another example of drop density distribution before the change of a drop recipe according to the first embodiment, FIG. 4B is a cross-sectional view of another example of a resist residual film thickness of an imprint pattern before the change of the drop recipe according to the first embodiment, FIG. 4C is a cross-sectional view of another example of drop density distribution after the change of the drop recipe according to the first embodiment, and FIG. 4D is a cross-sectional view of another example of the resist residual film thickness of the imprint pattern after the change of the drop recipe according to the first embodiment.

Referring to FIG. 4A, there is no level difference in the semiconductor layer 1 in the cell region R3. The imprint material 4 is dropped onto the insulation layer 3 in the cell region R3.

Next, as illustrated in FIG. 4B, the template 5 is pressed against the imprint material 4. In this case, there are variations in the width of the recessed portions 5A in the template 5. For example, when the designed value of the width of the recessed portions 5A in the template 5 is set to A1, the recessed portions 5A in the template 5 have the width A1 or width A2 (A2<A1). In the foregoing description, A2 represents a value obtained by subtracting a dimension error in the template 5 from A1. A dimension error in the template 5 can be caused by a manufacturing error in the template 5, temporal change such as stress applied to the template 5, the wear on the template 5, or the like.

Then, while the template 5 is pressed against the imprint material 4, the imprint material 4 is irradiated with ultraviolet rays to cure the imprint material 4. After the curing of the imprint material 4, the template 5 is separated from the imprint material 4 to form the imprint pattern 6 on the insulation layer 3. In this case, the imprint pattern 6 can have projecting portions 6A corresponding to the shape of the recessed portions 5A. The width of the projecting portions 6A can be set to A1 at the recessed portions 5A with the width A1 in the template 5. The width of the projecting portions 6A can be set to A2 at the recessed portions 5A with the width A2 in the template 5. In addition, the imprint pattern 6 has the residual film 6B formed thereon. In the cell region R3, the residual film thickness of the residual film 6B can be set to b. In this case, it is possible to prevent variations in the residual film thickness b of the residual film 6B in the cell region R3.

FIGS. 5A1 to 5A5 are cross-sectional views illustrating a formation method of the etching pattern 3' in a portion with a pattern width A1 of an imprint pattern 6 illustrated in FIG. 4B, and FIGS. 5B1 to 5B5 are cross-sectional views illustrating a formation method of the etching pattern 3' in a portion with a pattern width A2 of the imprint pattern 6 illustrated in FIG. 4B. FIG. 5A1 is obtained by cutting out the insulation layers 2 and 3 and the imprint pattern 6 corresponding to the recessed portions 5A with the width A1 in the template 5 in the cell region R3 illustrated in FIG. 4B, and FIG. 5B1 is obtained by cutting out the insulation layers 2 and 3 and the imprint pattern 6 corresponding to the recessed portions 5A with the width A2 in the template 5 in the cell region R3 illustrated in FIG. 4B.

Referring to FIGS. 5A1 and 5B1, in the cell region R3, the imprint pattern 6 has the projecting portions 6A with the width A1 and the projecting portions 6A with the width A2.

Next, as illustrated in FIGS. 5A1 to 5A4 and 5B1 to 5B4, the insulation layer 3 is subjected to the etching E1 using the imprint pattern 6 as a mask to form the etching pattern 3' on the insulation layer 2.

As illustrated in FIGS. 5A1 and 5B1, the residual film thickness b is uniform between the projecting portions 6A with the width A1 and the projecting portions 6A with the width A2 in the cell region R3. In this case, as illustrated in FIGS. 5A2 and 5B2, the residual film 6B is removed at the same time from the projecting portions 6A with the width A1 and the projecting portions 6A with the width A2 in the cell region R3.

As a result, the etching E1 on the insulation layer 3 is started at the same time at the projecting portions 6A with the width A1 and the projecting portions 6A with the width A2 in the cell region R3. Therefore, as illustrated in FIGS. 5A3 and 5B3, the etching pattern 3' penetrates the insulation layer 3 at the same time at the projecting portions 6A with the width A1 and the projecting portions 6A with the width A2 in the cell region R3. In this case, the width of the etching pattern 3' is A1 at the projecting portions 6A with the width A1, and the width of the etching pattern 3' is A2 at the projecting portions 6A with the width A2.

Next, as illustrated in FIGS. 5A4 and 5B4, when the etching pattern 3' is subjected to over-etching, the side etching E2 of the etching pattern 3' proceeds. Accordingly, the width of the etching pattern 3' is B1 (B1<A1) at the projecting portions 6A with the width A1, and the width of the etching pattern 3' is B2 (B2<A2) at the projecting portions 6A with the width A2. In this case, the etching amount of the side etching E2 becomes equal between the projecting portions 6A with the width A1 and the projecting portions 6A with the width A2. Accordingly, when A2<A1, B2<B1 holds. As a result, when the etching E1 is started at the same time at the projecting portions 6A with the width A1 and the projecting portions 6A with the width A2, the width of the etching pattern 3' varies. Specifically, when the residual film thickness b is uniform between the projecting portions 6A with the width A1 and the projecting portions 6A with the width A2, the width of the etching pattern 3' varies due to the variations in the width of the projecting portions 6A.

Next, as illustrated in FIGS. 5A5 and 5B5, after the etching E1, the residual imprint pattern 6 is removed from the etching pattern 3'.

When the difference between the width B1 and the width B2 of the etching pattern 3' does not fall within a prescribed range, the drop recipe of the imprint material 4 can be changed as illustrated in FIG. 4C. At the change of the drop recipe, the difference between the width B1 and the width B2 of the etching pattern 3' can be reduced. To reduce the difference between the width B1 and the width B2 of the etching pattern 3', the residual film thickness of the residual film 6B in the area with the width B2 of the etching pattern 3' is made larger than b. To make the residual film thickness of the residual film 6B in the area with the width B2 of the etching pattern 3' larger than b, the drop density of the imprint material 4 in the area with the width B2 of the etching pattern 3' is increased. To increase the drop density of the imprint material 4 in the area with the width B2 of the etching pattern 3', the spacing between the drops of the imprint material 4 in the area the width B2 of the etching pattern 3' illustrated in FIG. 4C is smaller than that illustrated in FIG. 4A.

To improve the accuracy of drop density distribution of the imprint material 4, the relationship between the residual film thickness of the imprint pattern 6 and the width of the etching pattern 3' can be referred to. In this case, the condition that the width of the projecting portions 6A in the imprint pattern 6 is uniform can be set.

Next, as illustrated in FIG. 4D, the template 5 is pressed against the imprint material 4. Then, while the template 5 is pressed against the imprint material 4, the imprint material 4 is irradiated with ultraviolet rays to cure the imprint material 4. After the hardening of the imprint material 4, the template 5 is separated from the imprint material 4 to form the imprint pattern 6' on the insulation layer 3. In this case, the imprint pattern 6 can have projecting portions 6A' corresponding to the shape of the recessed portions 5A. The width of the projecting portions 6A' can be set to A1 at the recessed portions 5A with the width A1 in the template 5. The width of the projecting portions 6A' can be set to A2 at the recessed portions 5A with the width A2 in the template 5. In addition, the imprint pattern 6' has the residual film 6B' formed thereon. The residual film thickness of the residual film 6B' is b in the area with width A1 of the projecting portions 6A', and the residual film thickness of the residual film 6B' is b" (b<b") in the area with the width A2 of the projecting portions 6A'.

FIGS. 6A1 to 6A5 are cross-sectional views illustrating a formation method of the etching pattern 3" with the width A1 of the imprint pattern 6' illustrated in FIG. 4D, and FIGS. 6B1 to 6B5 are cross-sectional views illustrating a formation method of the etching pattern 3" with the width A2 of the imprint pattern 6' illustrated in FIG. 4D. FIG. 6A1 is obtained by cutting out the insulation layers 2 and 3 and the imprint pattern 6' in the area with the width A1 of the projecting portions 6A' illustrated in FIG. 4D. FIG. 6B1 is obtained by cutting out the insulation layers 2 and 3 and the imprint pattern 6' in the cell region R3 in the area with the width A2 of the projecting portions 6A' illustrated in FIG. 4D.

Referring to FIGS. 6A1 and 6B1, the residual film thickness of the residual film 6B' is b in the area with the width A1 of the projecting portions 6A', and the residual film thickness of the residual film 6B' is b" in the area with the width A2 of the projecting portions 6A'.

Next, as illustrated in FIGS. 6A1 to 6A4 and 6B1 to 6B4, the insulation layer 3 is subjected to the etching E1 using the imprint pattern 6' as a mask to form the etching pattern 3" on the insulation layer 2.

As illustrated in FIGS. 6A1 and 6B1, the residual film thickness b" in the area with the width A2 of the projecting portions 6A' is larger than the residual film thickness b in the area with the width A1 of the projecting portions 6A'. Accordingly, as illustrated in FIGS. 6A2 and 6B2, when the residual film 6B' is removed from the insulation layer 3 in the area with the width A1 of the projecting portions 6A', the residual film 6B' remains on the insulation layer 3 in the area with the width A2 of the projecting portions 6A'.

As a result, the etching E1 on the insulation layer 3 in the area with the width A1 of the projecting portions 6A' is started earlier than the etching E1 on the insulation layer 3 in the area with the width A2 of the projecting portions 6A'. Therefore, as illustrated in FIGS. 6A3 and 6B3, the etching pattern 3" penetrates the insulation layer 3 in the area with the width A1 of the projecting portions 6A' before the etching pattern 3" penetrates the insulation layer 3 in the area with the width A2 of the projecting portions 6A'.

As illustrated in FIGS. 6A4 and 6B4, when the etching pattern 3" penetrates the insulation layer 3 in the area with the width A2 of the projecting portions 6A', the side etching E2 of the etching pattern 3" proceeds in the area with the width A1 of the projecting portions 6A'. After that, while the side etching E2 of the etching pattern 3" proceeds in the area with the width A1 of the projecting portions 6A', when the etching pattern 3" penetrates the insulation layer 3 in the area with the width A2 of the projecting portions 6A', the side etching E3 of the etching pattern 3" proceeds in the area with the width A2 of the projecting portions 6A'. Accordingly, the etching amount of the side etching E3 of the etching pattern 3" in the area with the width A2 of the projecting portions 6A' can be smaller than the etching amount of the side etching E2 of the etching pattern 3" in the area with the width A1 of the projecting portions 6A'. Therefore, even when the width of the projecting portions 6A' is A2<A1, the width B1 of the etching pattern 3" after the side etching E3 of the etching pattern 3" in the area with the width A2 of the projecting portions 6A' can be equal to the width B1 of the etching pattern 3" after the side etching E2 of the etching pattern 3" in the area with the width A1 of the projecting portions 6A'. Accordingly, even when the etching E1 is performed at the same time in the area with the width A1 of the projecting portions 6A' and the area with the width A2 of the projecting portions 6A', it is possible to prevent variations in the width of the etching pattern 3" between the area with the width A1 of the projecting portions 6A' and the area with the width A2 of the projecting portions 6A'.

Next, as illustrated in FIGS. 6A5 and 6B5, after the etching E1, the residual imprint pattern 6' is removed from the etching pattern 3".

In this case, changing the drop recipe of the imprint material 4 depending on variations in the dimension of the etching pattern 3' makes it possible to improve the uniformity of the width of the etching pattern 3". To change the drop recipe of the imprint material 4, the relationship between the residual film thickness of the imprint pattern 6 and the width of the etching pattern 3' can be referred to. Accordingly, even when variations in the dimension of the etching pattern 3' complexly depend on variations in the residual film thickness of the residual film 6B and variations in the dimension of the template 5, it is possible to improve the uniformity of the width of the etching pattern 3".

Figure 7:
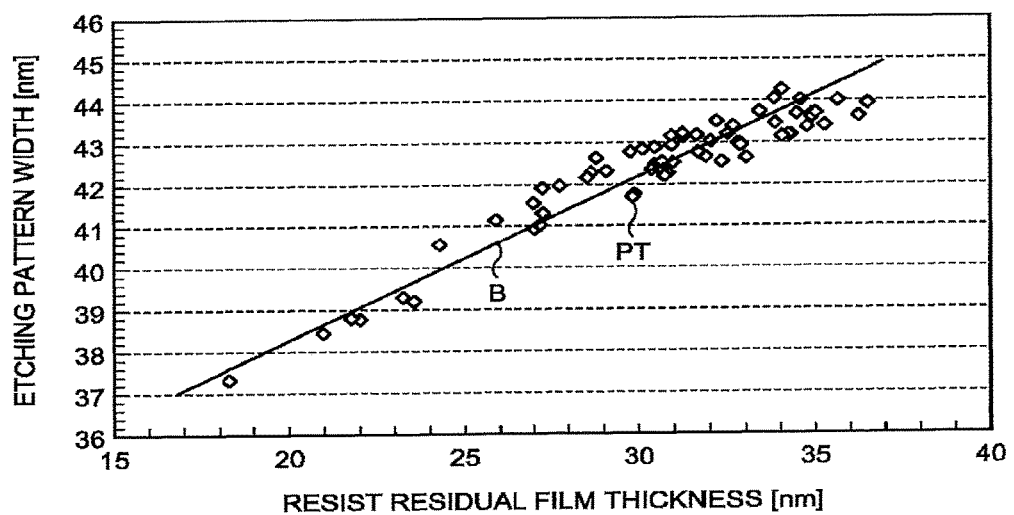
FIG. 7 is a diagram illustrating the relationship between the resist residual film thickness and the etching pattern width of an imprint pattern.

FIG. 7 is a diagram illustrating the relationship between the resist residual film thickness and the etching pattern width of an imprint pattern.

Referring to FIG. 7, the width of the etching pattern is measured for each of areas different in the value of the residual film thickness of the imprint pattern. The etching pattern can be formed by etching using the imprint pattern as a mask. The inclination of a straight line B most proximate to distribution of points PT with the measurement value of the residual film thickness of the imprint pattern in an X coordinate and the measurement value of the width of the etching pattern in a Y coordinate is calculated. The inclination of the straight line B corresponds to the change rate $\Delta CD/\Delta RLT$ of the width of the etching pattern with respect to the residual film thickness of the imprint pattern, where $\Delta CD$ represents a change in the width of the etching pattern and $\Delta RLT$ represents a change in the residual film thickness of the imprint pattern. The straight line B can be determined by least-square method or the like.

Figure 8:
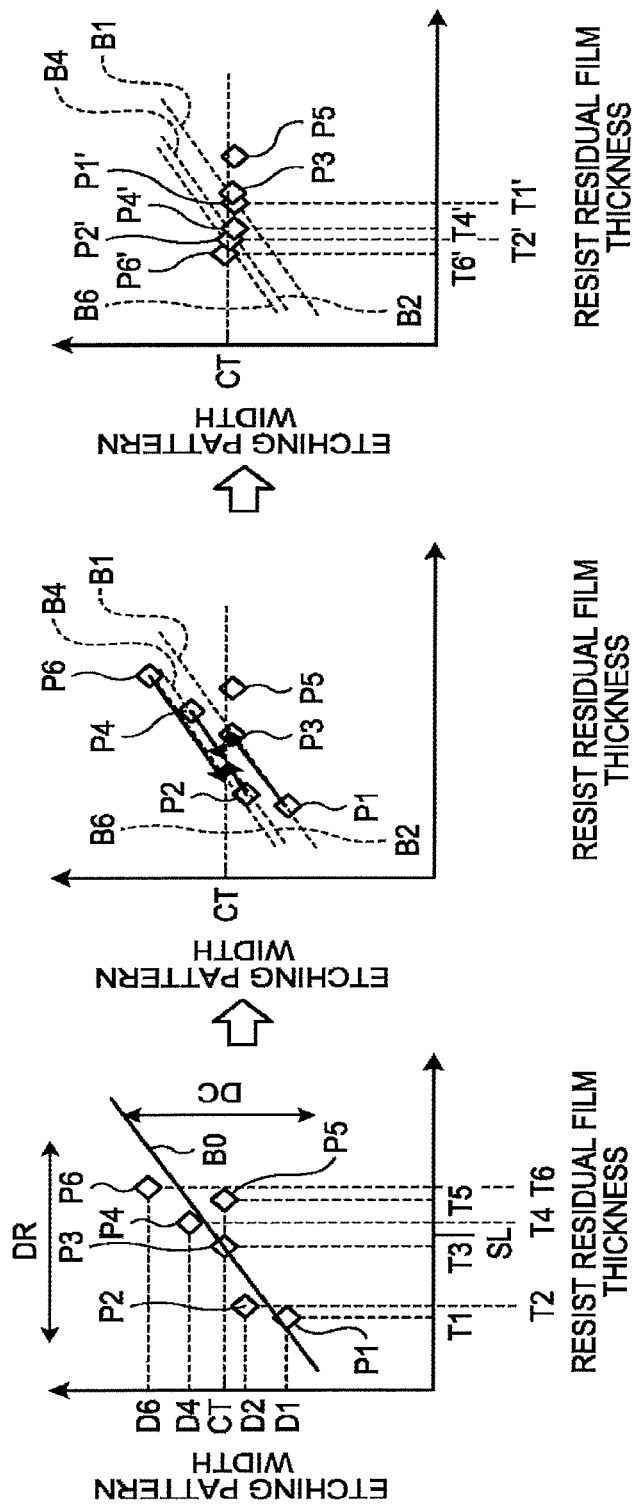
FIG. 8A is a diagram illustrating the relationship between the resist residual film thickness and etching pattern width of an imprint pattern before the change of a drop recipe.
FIG. 8B is a diagram illustrating a method for correcting the resist residual film thickness in the relationship illustrated in FIG. 8A.
FIG. 8C is a diagram illustrating the relationship between the resist residual film thickness and etching pattern width of the imprint pattern after the change of the drop recipe corresponding to the correction of the resist residual film thickness illustrated in FIG. 8B.

FIG. 8A is a diagram illustrating the relationship between the resist residual film thickness and etching pattern width of an imprint pattern before the change of a drop recipe, FIG. 8B is a diagram illustrating a method for correcting the resist residual film thickness in the relationship illustrated in FIG. 8A, and FIG. 8C is a diagram illustrating the relationship between the resist residual film thickness and etching pattern width of the imprint pattern after the change of the drop recipe corresponding to the correction of the resist residual film thickness illustrated in FIG. 8B.

Referring to FIG. 8A, the resist residual film thickness is given a set value SL, and the etching pattern width is given a target value CT. The target value CT can be set to about 10 to 40 nm, for example. Variations DC in the etching pattern width occur depending on variations DR in the resist residual film thickness. In this case, points P1 to P6 can be obtained by measuring the resist residual film thickness and the etching pattern width. The measurement values of the resist residual film thickness at the points P1 to P6 can be given as T1 to T6. The measurement values of the etching pattern width at the points P1 to P6 can be given as D1, D2, CT, D4, CT, and D6. Then, the inclination of a straight line B0 most proximate to the distribution of the points P1 to P6 is calculated.

Next, as illustrated in FIG. 8B, correction curves B1, B2, B4, and B6 equal in inclination to the straight line B0 are determined. The correction curve B1 passes through the point P1. The correction curve B2 passes through the point P2. The correction curve B4 passes through the point P4. The correction curve B6 passes through the point P6. The measurement values of the etching pattern width at the points P3 and P5 are equal to the target value CT, and the resist residual film thickness at the points P3 and P5 needs no change.

Next, as illustrated in FIG. 8C, the points P1, P2, P4, and P6 are moved respectively to points P1', P2', P4', and P6' where the etching pattern width coincides with the target value CT along the correction curves B1, B2, B4, and B6. In this case, when the resist residual film thickness at the points P1', P2', P4', and P6' change respectively to T1', T2', T4', and T6', the drop recipe can be changed such that the resist residual film thickness at the points P1, P2, P4, and P6 become respectively T1', T2', T4', and T6'. Accordingly, even when there are variations DC in the etching pattern width before the change of the drop recipe, it is possible to make the etching pattern width at the points P1, P2, P4, and P6 equal to the target value CT after the change of the drop recipe.

Second Embodiment

Figure 9:
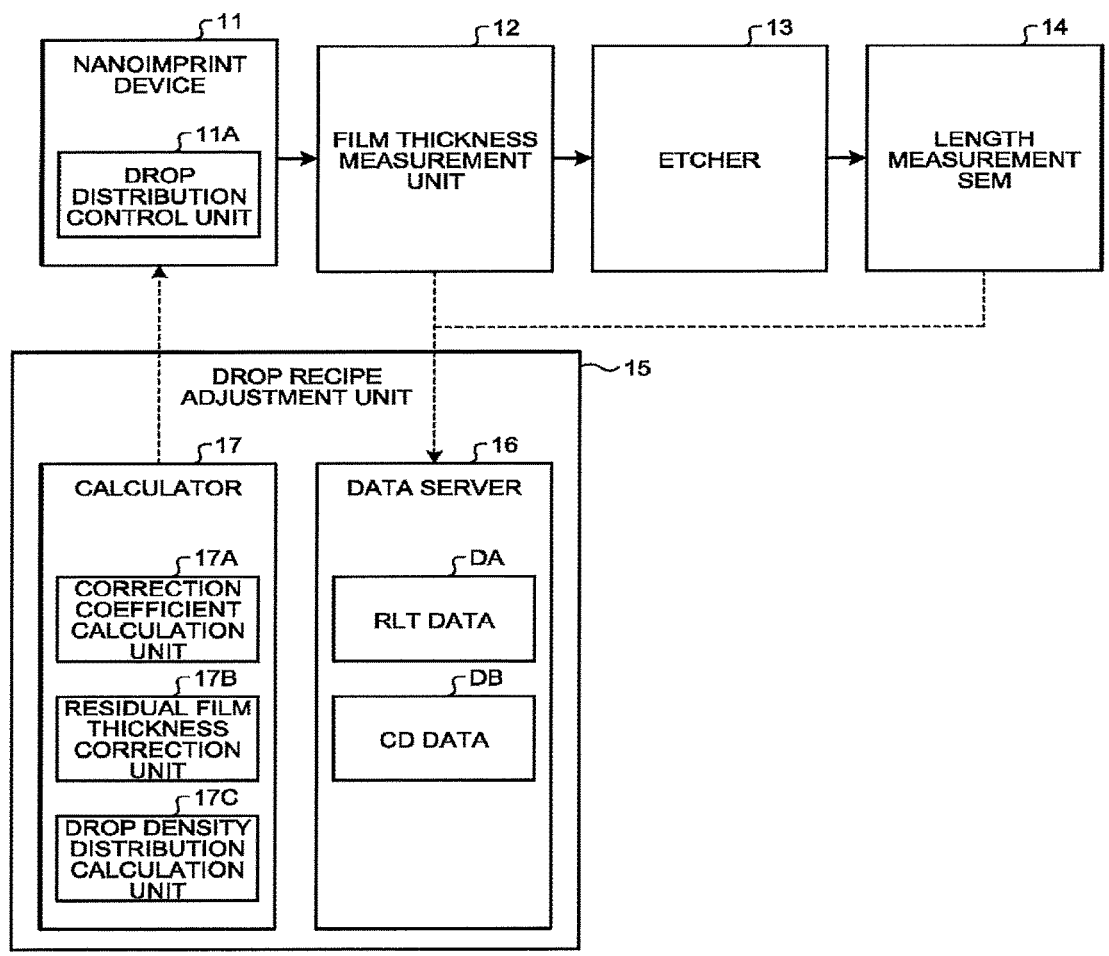
FIG. 9 is a block diagram of a schematic configuration of a pattern formation system according to a second embodiment.

FIG. 9 is a block diagram of a schematic configuration of a pattern formation system according to a second embodiment.

Referring to FIG. 9, the pattern formation system includes a nanoimprint device 11, a film thickness measurement unit 12, an etcher 13, a length measurement SEM 14, and a drop recipe adjustment unit 15. The film thickness measurement unit 12 can be, for example, an ellipsometer or a scatterometry, for example. The nanoimprint device 11 includes a drop distribution control unit 11A. The drop recipe adjustment unit 15 includes a data server 16 and a calculator 17. The calculator 17 includes a correction coefficient calculation unit 17A, a residual film thickness correction unit 17B, and a drop density distribution calculation unit 17C. The drop recipe adjustment unit 15 may be incorporated into the nanoimprint device 11.

The drop distribution control unit 11A can control the drop position of the imprint material depending on the drop density of the imprint material corresponding to the residual film thickness corrected based on the relationship between the residual film thickness of the imprint pattern and the dimension of the etching pattern formed using the imprint pattern as a mask. The correction coefficient calculation unit 17A can calculate the change rate of the dimension of the etching pattern with respect to the residual film thickness of the imprint pattern. The residual film thickness correction unit 17B can correct the residual film thickness of the imprint pattern according to the change rate calculated by the correction coefficient calculation unit 17A. Correcting the residual film thickness makes it possible to reduce variations in the dimension of the etching pattern. The drop density distribution calculation unit 17C can calculate the drop density of the imprint material corresponding to the residual film thickness of the imprint pattern corrected by the residual film thickness correction unit 17B.

An example of operation of the pattern formation system illustrated in FIG. 9 will be described with reference to the states illustrated in FIGS. 1A to 1D, 2A1 to 2A5, 2B1 to 2B5, 3A1 to 3A5, and 3B1 to 3B5.

The present wafer with the semiconductor layer 1 and the insulation layers 2 and 3 illustrated in FIG. 1A is conveyed to the nanoimprint device 11. In the nanoimprint device 11, the imprint material 4 is dropped onto the insulation layer 3 as illustrated in FIG. 1A. After that, in the nanoimprint device 11, the template 5 is pressed against the imprint material 4, and the imprint material 4 is irradiated with ultraviolet rays to form the imprint pattern 6 on the insulation layer 3 as illustrated in FIG. 1B.

The present wafer with the imprint pattern 6 is conveyed to the film thickness measurement unit 12. In the film thickness measurement unit 12, the residual film thickness of the residual film 6B in the imprint pattern 6 illustrated in FIG. 1B is measured. The residual film thickness of the residual film 6B can be measured for each of areas different in the residual film thickness. The residual film thickness measured by the film thickness measurement unit 12 is stored as RLT data DA in the data server 16.

The present wafer measured in the residual film thickness of the imprint pattern 6 is conveyed to the etcher 13. As illustrated in FIGS. 2A1 to 2A4 and 2B1 to 2B4, the etcher 13 subjects the insulation layer 3 to the etching E1 using the imprint pattern 6 as a mask to form the etching pattern 3' on the insulation layer 2.

The present wafer with the etching pattern 3' is conveyed to the length measurement SEM 14. The length measurement SEM 14 measures the width of the etching pattern 3' illustrated in FIGS. 2A5 and 2B5. The width of the etching pattern 3' can be measured for each of areas different in the residual film thickness of the residual film 6B. The width of the etching pattern 3' measured by the length measurement SEM 14 is stored as critical dimension (CD) data DB in the data server 16.

The RLT data DA and the CD data DB stored in the data server 16 are sent to the calculator 17. Then, the correction coefficient calculation unit 17A calculates the change rate of the width of the etching pattern 3' with respect to the residual film thickness of the imprint pattern 6 with reference to the RLT data DA and the CD data DB. The change rate can be used as CD correction coefficient. Next, the residual film thickness correction unit 17B corrects the residual film thickness of the imprint pattern 3' according to the CD correction coefficient calculated by the correction coefficient calculation unit 17A. In this case, the residual film thickness of the imprint pattern 3' can be corrected such that the width of the etching pattern 3' coincides with the target value. Next, the drop density distribution calculation unit 17C calculates the drop density of the imprint material 4 corresponding to the residual film thickness of the imprint pattern 3' corrected by the residual film thickness correction unit 17B in each area.

The drop density in each area calculated by the drop density distribution calculation unit 17C is sent to the nanoimprint device 11. In addition, the next wafer with the semiconductor layer 1 and the insulation layers 2 and 3 illustrated in FIG. 1C is conveyed to the nanoimprint device 11. In the nanoimprint device 11, as illustrated in FIG. 1C, the imprint material 4 is dropped onto the insulation layer 3. In this case, the drop distribution control unit 11A controls the drop position of the imprint material 4 based on the drop density in each area calculated by the drop density distribution calculation unit 17C. After that, in the nanoimprint device 11, the template 5 is pressed against the imprint material 4, and the imprint material 4 is irradiated with ultraviolet rays to form the imprint pattern 6' on the insulation layer 3 as illustrated in FIG. 1D.

The next wafer with the imprint pattern 6' is conveyed to the film thickness measurement unit 12. The film thickness measurement unit 12 measures the residual film thickness of the residual film 6B' in the imprint pattern 6' illustrated in FIG. 1D. The residual film thickness of the residual film 6B' can be measured for each of areas different in the residual film thickness. The residual film thicknesses measured by the film thickness measurement unit 12 are stored as RLT data DA in the data server 16.

The next wafer with the measured residual film thickness of the imprint pattern 6' is conveyed to the etcher 13. The etcher 13 subjects the insulation layer 3 to the etching E1 using the imprint pattern 6' as a mask to form the etching pattern 3" on the insulation layer 2 as illustrated in FIGS. 3A1 to 3A4 and 3B1 to 3B4.

The next wafer with the etching pattern 3" is conveyed to the length measurement SEM 14. The length measurement SEM 14 measures the width of the etching pattern 3" illustrated in FIGS. 3A5 and 3B5. The width of the etching pattern 3" can be measured for each of areas different in the residual film thickness of the residual film 6B'. The width of the etching pattern 3" measured by the length measurement SEM 14 is stored as CD data DB in the data server 16. The length measurement SEM 14 determines whether the width of the etching pattern 3" falls within the specification based on the CD data DB.

With reference to the relationship between the residual film thickness of the imprint pattern 6 and the width of the etching pattern 3' to change the drop recipe of the imprint material 4, it is possible to improve the accuracy of the value as a guide for the correction amount of the residual film thickness. This improves the accuracy of the change of the drop recipe to even out variations in the width of the etching pattern 3' and eliminate the need to create the drop recipe many times.

FIG. 10A is a plane view of an example of drop density distribution before the change of a drop recipe calculable by the pattern formation system illustrated in FIG. 9, and FIG. 10B is a plane view of an example of drop density distribution after the change of the drop recipe calculable by the pattern formation system illustrated in FIG. 9.

Referring to FIG. 10A, a shot region SH includes a chip region RA and a kerf region RB. FIG. 10A illustrates an example in which 12 chips are provided in one shot. Before the change of the drop recipe, the residual film thickness of the imprint pattern 6 is made uniform in the chip region RA and the kerf region RB. FIG. 10A illustrates the case in which the residual film thickness is smaller in the kerf region RB than the chip region RA.

After the change of the drop recipe, as illustrated in FIG. 10B, the residual film thickness changes within the chip region RA, and the residual film thickness changes within the kerf region RB. In this case, the residual film thicknesses in the chip region RA and the kerf region RB can reflect the tendency of dimensional variations in the template 5 in the shot region SH, the tendency of variations in the etching amount in the shot region SH, and the like.

FIG. 11A is a plane view of another example of drop density distribution before the change of a drop recipe calculable by the pattern formation system illustrated in FIG. 9, and FIG. 11B is a plane view of another example of drop density distribution after the change of the drop recipe calculable by the pattern formation system illustrated in FIG. 9.

Referring to FIG. 11A, a wafer W has a shot region SH. Before the change of the drop recipe, the residual film thickness of the imprint pattern 6 is made uniform among the shot regions SH in the entire wafer W.

After the change of the drop recipe, as illustrated in FIG. 11B, the residual film thickness varies among the shot regions SH. In this case, the residual film thicknesses in the shot regions SH can reflect the tendency of a warp in the wafer W, the tendency of variations in the etching amount of the wafer W, the tendency of variations in the film thickness of the etching material in the wafer W, and the like.

Figure 12:
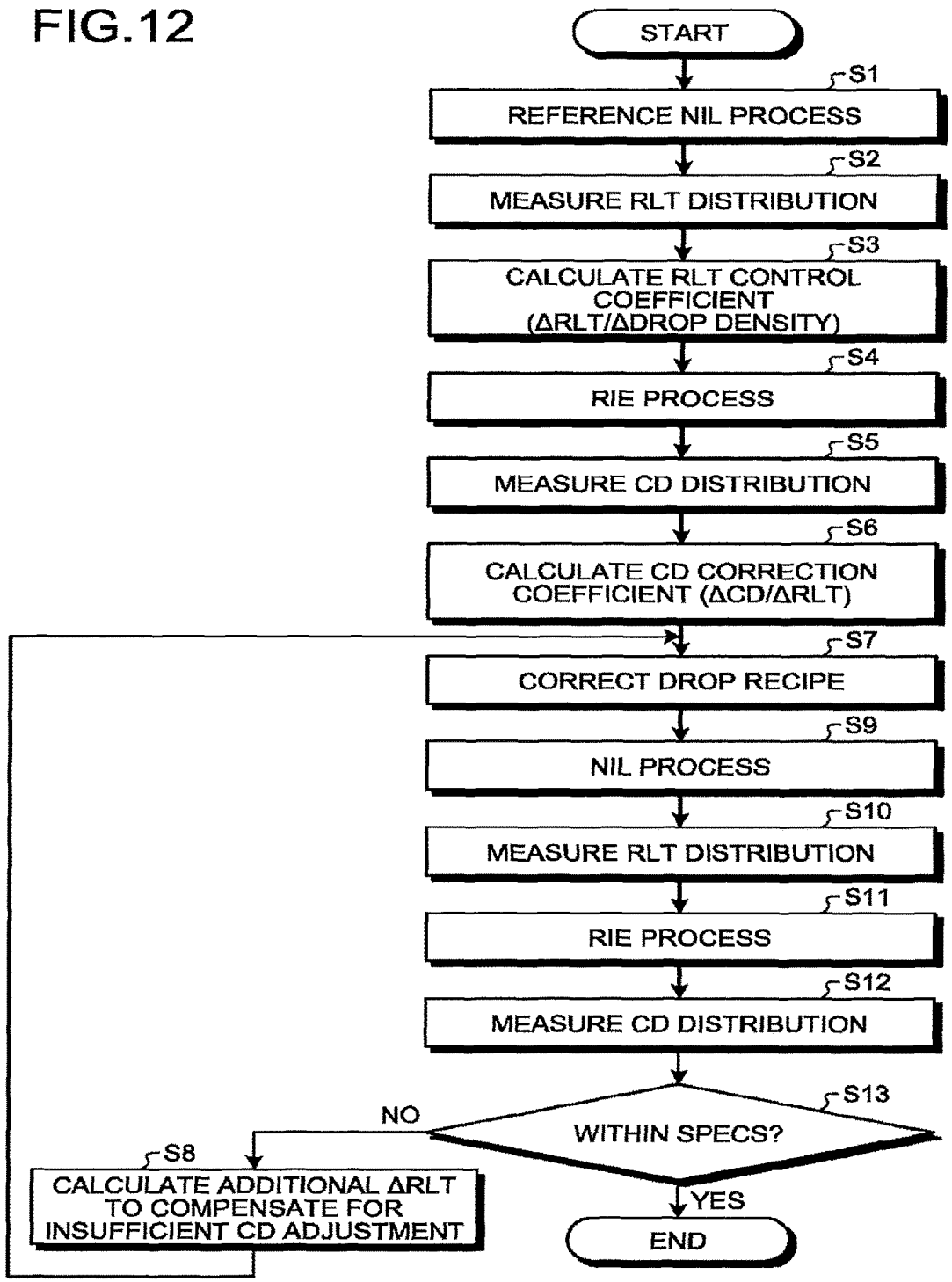
FIG. 12 is a flowchart of a drop recipe adjustment method according to a third embodiment.

FIG. 12 is a flowchart of a drop recipe adjustment method according to a third embodiment.

Referring to FIG. 12, a reference nanoimprint lithography (NIL) process is performed (step S1). The reference NIL process is a preliminary NIL process to obtain the relationship between the residual film thickness of a resist pattern used as an imprint pattern and the width of an etching pattern formed using the resist pattern as a mask. In this case, a plurality of samples with different RLTs assigned as necessary may be prepared. This process is performed by the nanoimprint device 11 illustrated in FIG. 9.

Next, RLT distribution of the resist pattern is measured (step S2). This measurement can be performed by the film thickness measurement unit 12 illustrated in FIG. 9.

Next, an RLT control coefficient is calculated (step S3). The RLT control coefficient corresponds to the change rate of the residual film thickness of the resist pattern with respect to the drop density of the resist material ($\Delta$RLT/$\Delta$drop density), where the $\Delta$drop density is the change rate of the drop density. This calculation can be performed by the drop recipe adjustment unit 15 illustrated in FIG. 9.

Next, a reactive ion etching (RIE) process is performed on the etching material using the resist pattern as a mask (step S4). This process can be performed by the etcher 13 illustrated in FIG. 9.

Next, CD distribution of the etching pattern is measured (step S5). This measurement can be made by the length measurement SEM 14 illustrated in FIG. 9.

Next, a CD correction coefficient ($\Delta$CD/$\Delta$RLT) is calculated based on the RLT distribution measured at S2 and the CD distribution measured at step S5 (step S6). This calculation can be performed by the drop recipe adjustment unit 15 illustrated in FIG. 9.

Next, the drop density of the resist material is calculated in each area based on the RLT control coefficient calculated at step S3 and the CD correction coefficient calculated at step S6 to correct the drop recipe (step S7). This correction can be made by the drop recipe adjustment unit 15 illustrated in FIG. 9.

Next, an NIL process is performed (step S9). In this case, the resist material can be dropped onto the etching material based on the drop recipe corrected at step S7. This process can be performed by the nanoimprint device 11 illustrated in FIG. 9.

Next, RLT distribution of the resist pattern is measured (step S10). This measurement can be made by the film thickness measurement unit 12 illustrated in FIG. 9.

Next, a reactive ion etching (RIE) process is performed on the etching material using the resist pattern as a mask (step S11). This process can be performed by the etcher 13 illustrated in FIG. 9.

Next, CD distribution of the etching pattern is measured (step S12). This measurement can be made by the length measurement SEM 14 illustrated in FIG. 9.

Next, it is determined whether the width of the etching pattern falls within the specifications (step S13). When the width of the etching pattern falls within the specifications, the NIL process is terminated.

Meanwhile, when the width of the etching pattern does not fall within the specifications, additional $\Delta$RLT to compensate for insufficient CD adjustment is calculated, and then the process moves to step S7 (step S8). This calculation can be performed by the drop recipe adjustment unit 15 illustrated in FIG. 9. Then, the drop recipe is corrected to add the ΔRLT calculated at step S8 (step S7). When the drop recipe is corrected, process of steps S8 to S13 can be repeated until the width of the etching pattern falls within the specifications.

Figure 13B:
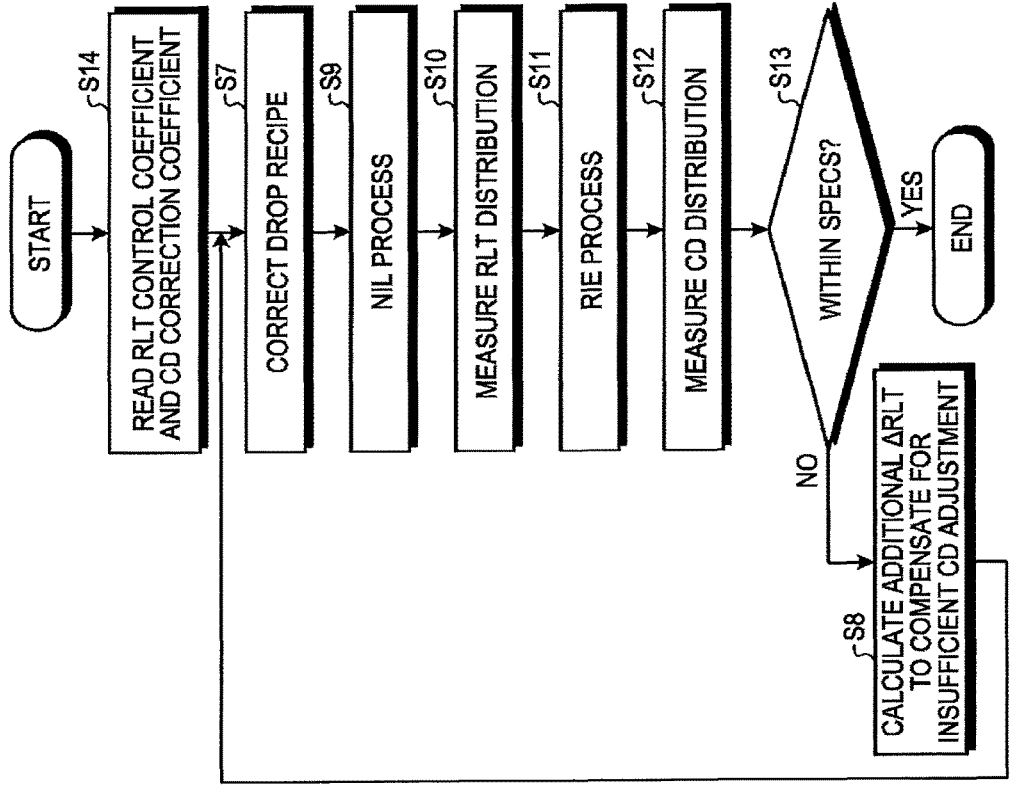
FIGS. 13A and 13B are flowcharts of a drop recipe adjustment method according to a fourth embodiment.
Figure 13A:
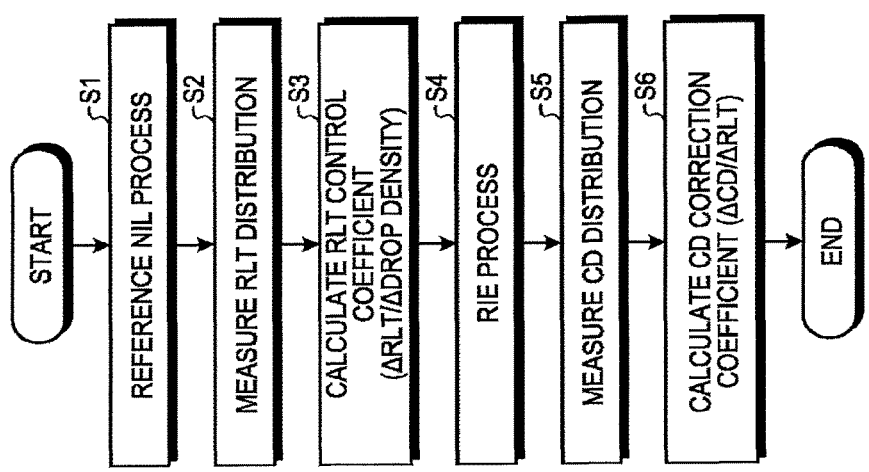

FIGS. 13A and 13B are flowcharts of a drop recipe adjustment method according to a fourth embodiment.

In the process of FIGS. 13A and 13B, process of step S14 is added to the process of FIG. 12. The other process of steps S1 to S13 is identical to that of FIG. 12.

In the process of FIG. 12, however, the calculator 17 illustrated in FIG. 9 executes the calculation of the RLT control coefficient (step S3), the calculation of the CD correction coefficient (step S6), the correction of the drop recipe (step S7), and the calculation of the additional ΔRLT (step S8).

In contrast, in the process of FIGS. 13A and 13B, the calculator 17 illustrated in FIG. 9 executes the calculation of the RLT control coefficient (step S3) and the calculation of the CD correction coefficient (step S6), and a calculator other than the calculator 17 illustrated in FIG. 9 executes the correction of the drop recipe (step S7) and the calculation of the additional ΔRLT (step S8). The other calculator reads the RLT control coefficient and the CD correction coefficient calculated by the calculator 17 illustrated in FIG. 9 to correct the drop recipe (step S14).

In this case, a calculator other than the calculator 17 illustrated in FIG. 9 executes the correction of the drop recipe (step S7) and the calculation of the additional ΔRLT (step S8) to reduce a load on the calculator 17 illustrated in FIG. 9.

Figure 14:
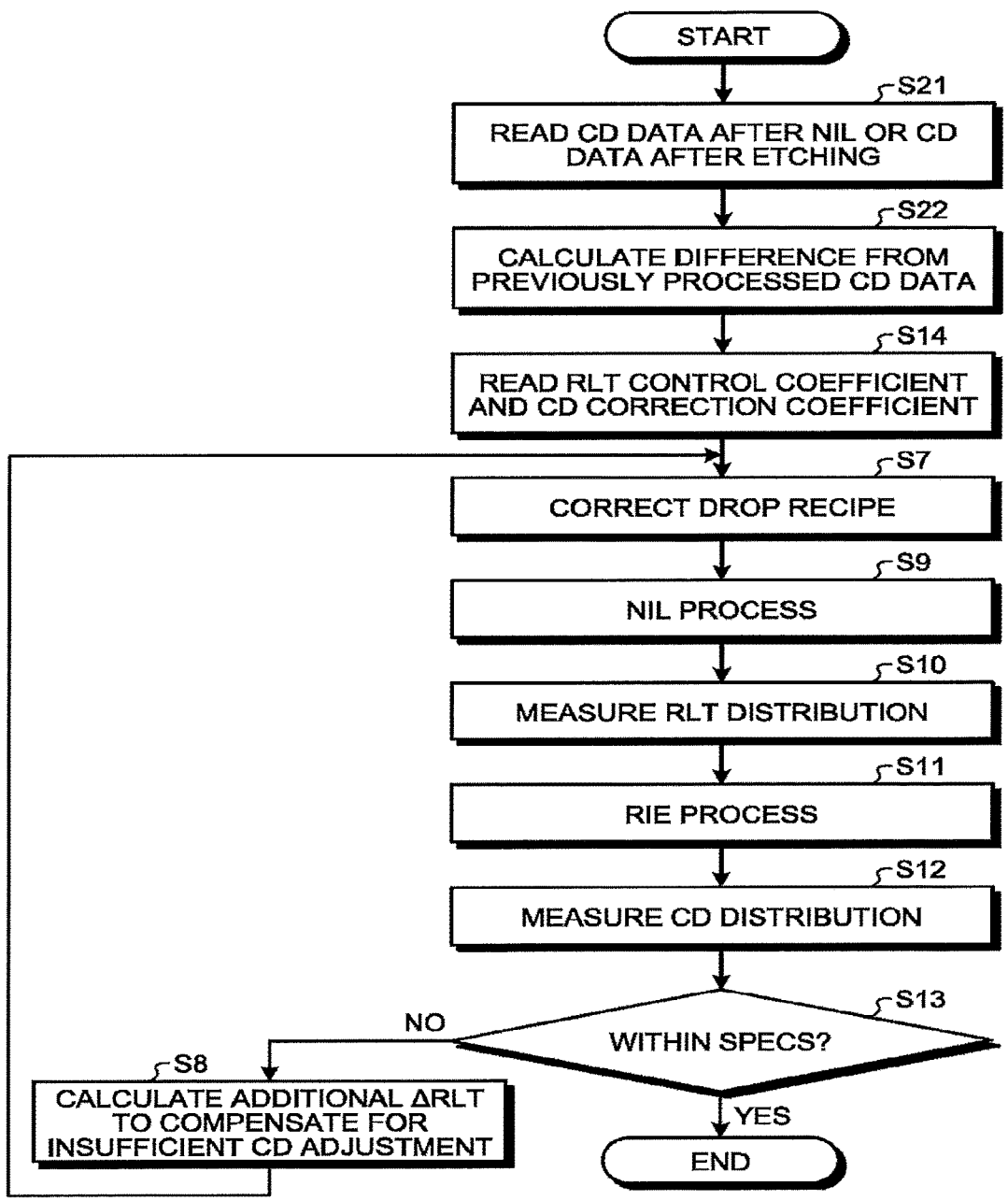
FIG. 14 is a flowchart of a drop recipe adjustment method according to a fifth embodiment.

FIG. 14 is a flowchart of a drop recipe adjustment method according to a fifth embodiment.

Before the start of the process of FIG. 14, the process of FIG. 12 or FIGS. 13A and 13B can be performed. The process of FIG. 12 or FIGS. 13A and 13B can be used to, when the dimensional variations in the etching pattern do not fall within the specifications, bring the dimensional variations in the etching pattern into the specifications. Once the dimensional variations in the etching pattern fall within the specifications, the same drop recipe can be used for the dimensional variations in the etching pattern as far as the template or the wafer lot is the same.

Meanwhile, when the template is replaced or the wafer lot is changed, the dimensional variations in the etching pattern slightly change. In this case, the process of FIG. 14 can be executed.

Referring to FIG. 14, the dimension of the imprint pattern after the NIL process or the dimension of the etching pattern after the etching is measured and the dimension of the imprint pattern or the dimension of the etching pattern is read as CD data (step S21).

Next, the difference between the current CD data and the previously-processed CD data is calculated (step S22). The CD data may be either the dimension of the imprint pattern or the dimension of the etching pattern. After that, the same process as the process of FIG. 13B can be performed (steps S14 and S7 to S13). However, at the correction of the drop recipe (step S7) described in FIG. 14, an RLT correction to eliminate the difference calculated at S22 can be calculated by the use of the CD correction coefficient, and a drop density correction corresponding to the RLT correction can be calculated by the use of the RLT control coefficient.

Accordingly, even when the template is replaced or the wafer lot is changed, there is no need each time to calculate the CD correction coefficient and the RLT control coefficient to correct the drop recipe, thereby to decrease the number of steps.

Figure 15:
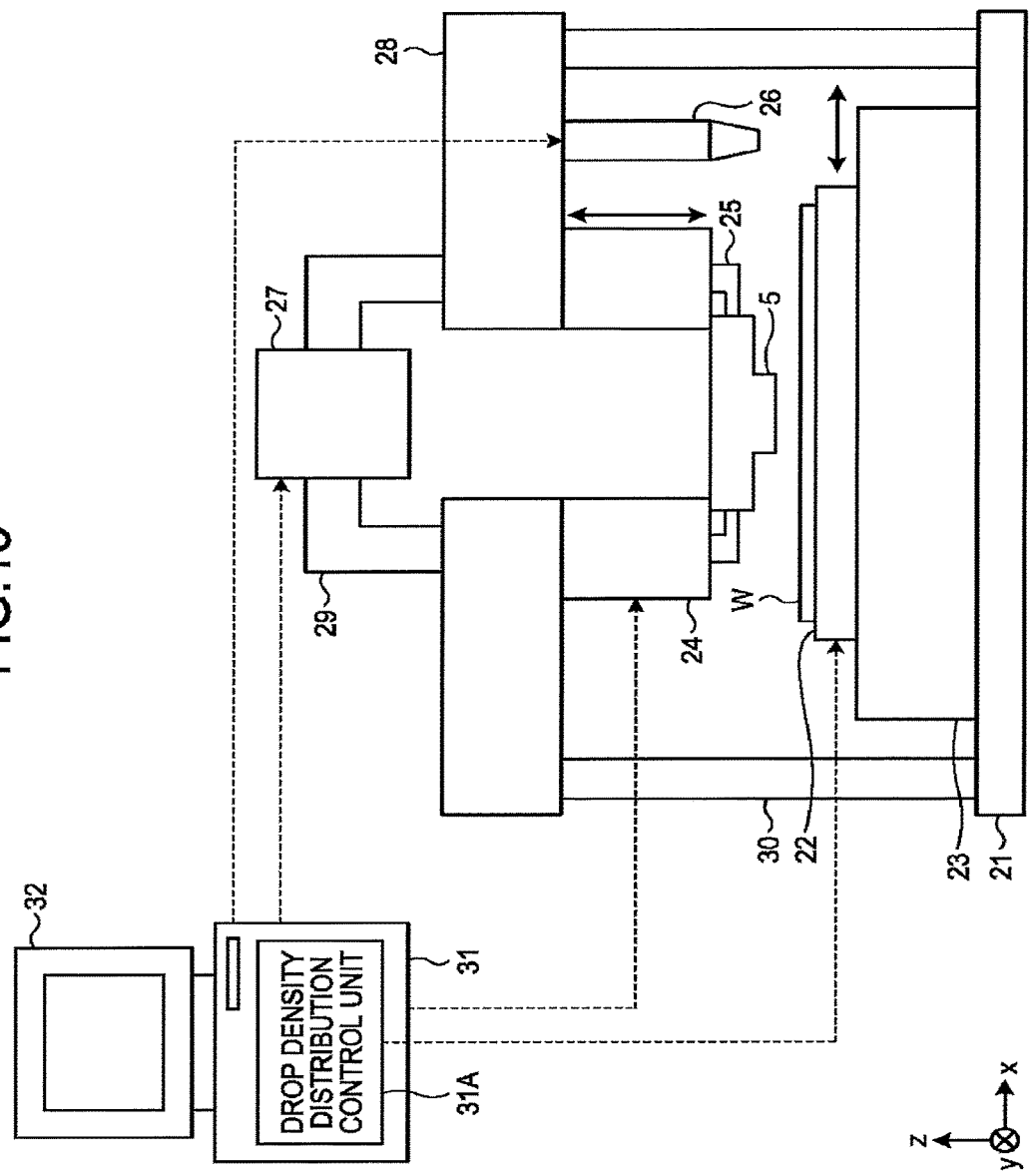
FIG. 15 is a side view of a schematic configuration of a nanoimprint device according to a sixth embodiment.

FIG. 15 is a side view of a schematic configuration of a nanoimprint device according to a sixth embodiment.

Referring to FIG. 15, the nanoimprint device includes a base 21 that supports the entire device, a stage 22 on which a wafer W is placed, a horizontal drive unit 23 that drives horizontally the stage 22, a vertical drive unit 24 that drives vertically the template 5, a support unit 25 that supports the template 5 under the vertical drive unit 24, a drop unit 26 that drops an imprint material onto a wafer W, an irradiation unit 27 that irradiates the wafer W with ultraviolet rays, a support unit 28 that supports the vertical drive unit 24 and the drop unit 26 on the wafer W, a support unit 29 that supports the irradiation unit 27 on the template 5, and a support unit 30 that supports the support unit 28 on the wafer W.

The nanoimprint device includes a control unit 31 that controls a nanoimprint operation and a display unit 32 that displays an operation screen for the nanoimprint device, an operation status, and the like. The control unit 31 includes a drop density distribution control unit 31A. The drop density distribution control unit 31A can control the drop position of the imprint material depending on the drop density of the imprint material corresponding to the residual film thickness corrected based on the relationship between the residual film thickness of the imprint pattern and the dimension of the etching pattern formed using the imprint pattern as a mask.

When the wafer W is conveyed onto the top of the stage 22, the stage 22 is driven horizontally to move the shot region in the wafer W to a position under the drop unit 26. In addition, the imprint material is dropped onto the wafer W from the drop unit 26 by an inkjet method or the like. In this case, the drop density distribution control unit 31A controls the position of the stage 22 at the time of drop of droplets based on the drop density in each area specified by the drop recipe to control the drop position of the imprint material. When one shot of the imprint material is dropped, the template 5 is lowered and pressed against the imprint material. In that state, the irradiation unit 27 irradiates the imprint material with ultraviolet rays via the template 5 to cure the imprint material, thereby forming the imprint pattern to which the recessed-projecting pattern in the template 5 is transferred.

In this case, the drop density distribution control unit 31A controls the drop position of the imprint material to improve the uniformity of the dimension of the etching pattern formed by etching using the imprint pattern as a mask.

The control unit 31 can be a personal computer, for example. In this case, the control unit 31 may be provided with the drop recipe adjustment unit 15 illustrated in FIG. 9. Alternatively, the control unit 31 may be provided with the calculator 17 of the drop recipe adjustment unit 15 illustrated in FIG. 9 and the data server 16 may be provided separately from the control unit 31.

Figure 16:
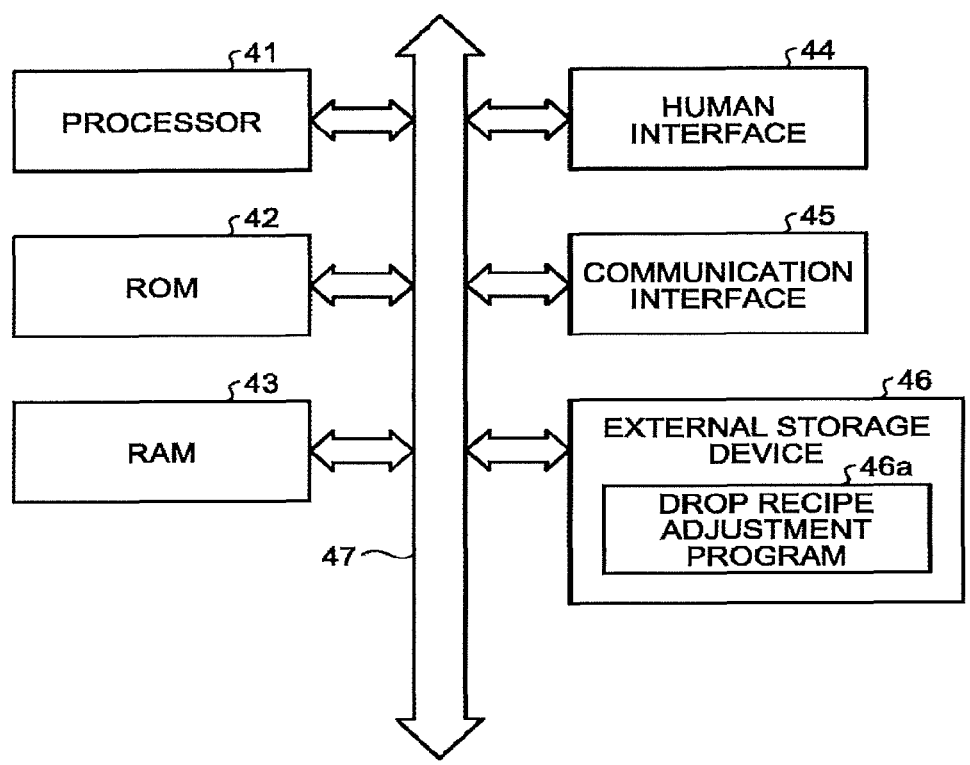
FIG. 16 is a block diagram of a hardware configuration in which a drop recipe adjustment program according to a seventh embodiment is executed.

FIG. 16 is a block diagram of a hardware configuration in which a drop recipe adjustment program according to a seventh embodiment is executed.

The hardware configuration illustrated in FIG. 16 corresponds to the calculator 17 illustrated in FIG. 9. The calculator 17 can include a processor 41 including a CPU, a ROM 42 storing fixed data, a RAM 43 providing a work area for the processor 41, a human interface 44 mediating between humans and a computer, a communication interface 45 providing a means for communication with the outside, and an external storage device 46 storing programs and various data for operating the processor 41. The processor 41, the ROM 42, the RAM 43, the human interface 44, the communication interface 45, and the external storage device 46 are connected via a bus 47.

The external storage device 46 can be, for example, a magnetic disc such as a hard disc, an optical disc such as a DVD, a non-volatile semiconductor storage device such as an SSD, a portable semiconductor storage device such as a USB memory or a memory card. The human interface 44 may be, for example, a keyboard, a mouse, or a touch panel as an input interface and may be a display or a printer as an output interface. The communication interface 45 may be, for example, a LAN card, a modem, a router, or the like for connection to the Internet and LANs. The external storage device 46 has a drop recipe adjustment program 46a installed therein. The drop recipe adjustment program 46a can implement the functions of the correction coefficient calculation unit 17A, the residual film thickness correction unit 17B, and the drop density distribution calculation unit 17C illustrated in FIG. 9.

When the processor 41 executes the drop recipe adjustment program 46a, the RLT data DA and the CD data DB described in FIG. 9 are referred to calculate the change rate of the width of the etching pattern with respect to the residual film thickness of the imprint pattern. The change rate can be used as CD correction coefficient. Next, the drop density of the imprint material is calculated for each area in correspondence with the residual film thickness of the imprint pattern corrected according to the CD correction coefficient.

The drop recipe adjustment program 46a to be executed by the processor 41 may be stored in the external storage device 46 and read into the RAM 43 at the time of execution of the program, may be stored in advance in the ROM 42, or may be acquired via the communication interface 45. In addition, the drop recipe adjustment program 46a may be executed by a standalone computer or a cloud computer.

In the foregoing embodiment, as the dimension of the etching pattern, the width of the etching pattern is taken as an example. However, the dimension of the etching pattern is not limited to the width of the etching pattern but may be the spacing, the hole diameter, or the pillar diameter in the etching pattern.

Figure 17:
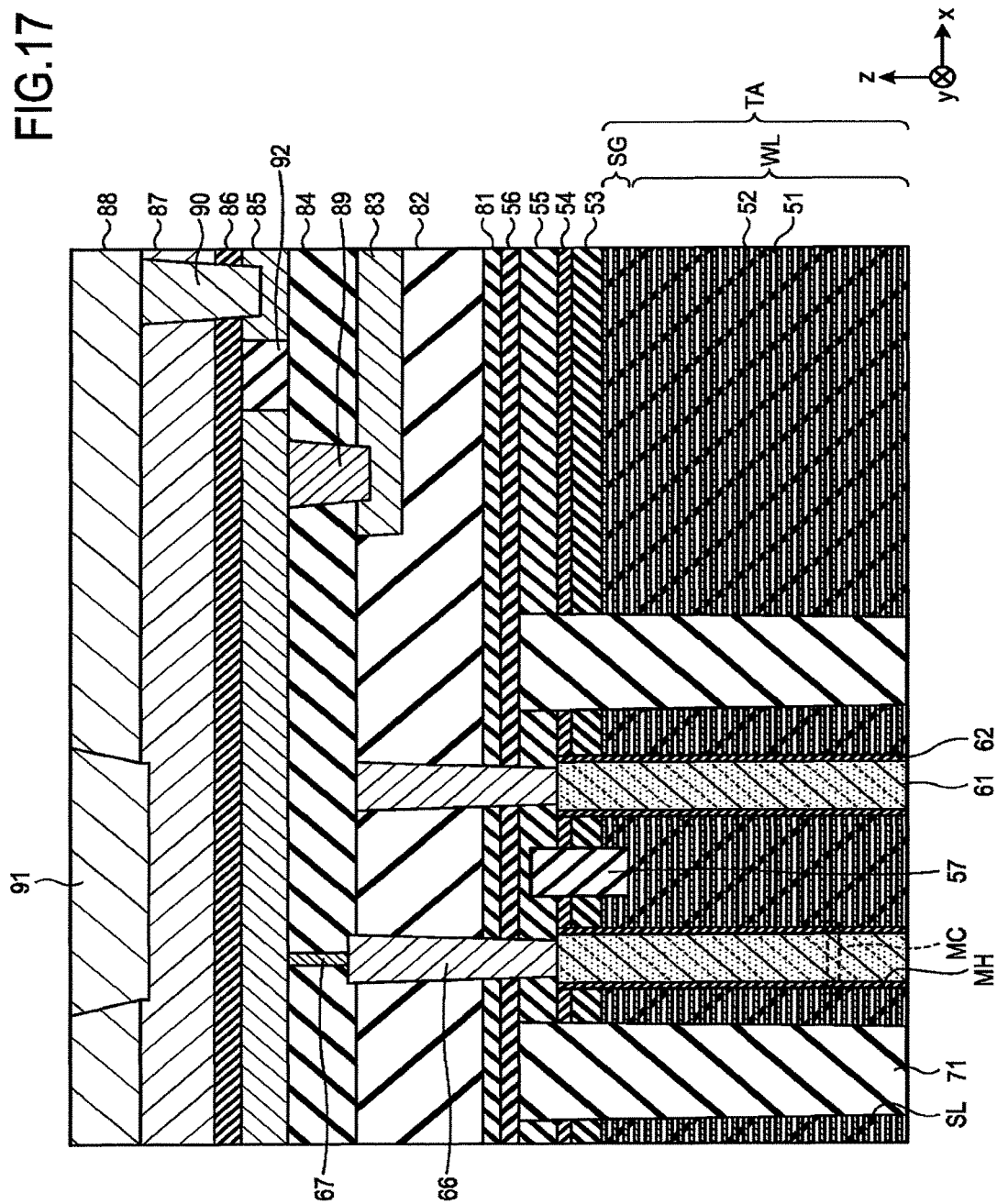
FIG. 17 is a cross-sectional view of an example of a semiconductor storage device to which a pattern formation method according to an eighth embodiment is applied.

FIG. 17 is a cross-sectional view of an example of a semiconductor storage device to which a pattern formation method according to an eighth embodiment is applied. FIG. 17 illustrates an NAND flash memory in which memory cells are arranged three-dimensionally as an example.

Referring to FIG. 17, the semiconductor storage device has a stacked body TA. The stacked body TA has insulation layers 51 and conductive layers 52 alternately stacked in a height direction z. The film thicknesses of the insulation layers 51 and the conductive layers 52 can be set to about several tens of nm, for example. The numbers of the insulation layers 51 and the conductive layers 52 can be set to about several tens to several hundreds, for example. The top three ones of the conductive layers 52 can be used as select gate lines SG, and the conductive layers 52 under the select gate lines SG can be used as word lines WL, for example.

Insulation layers 53 to 56 are stacked in sequence on the stacked body TA. The stacked body TA and the insulation layers 53 to 54 have memory holes MH formed in the height direction z, the stacked body TA and the insulation layers 53 to 55 have slits SL formed in the height direction z. The diameter of the memory holes MH can be set to several tens of nm, for example.

Memory films 62 are provided on the inner peripheries of the memory holes MH, and semiconductors 61 are provided inside the memory films 62. The memory films 62 can have a multi-layer structure including a block insulation film, a charge trap film, and a tunnel oxide film, for example. One memory cell MC can be formed from one conductive layer 52, and the memory film 62 and the semiconductor 61 in one memory hole MH. The slits SL have insulators 71 embedded therein.

Insulators 57 are embedded in the top portion of the stacked body TA and the insulation layers 53 to 55 between the memory holes MH. The insulators 57 cut the select gate lines SG in a row direction y. Insulation films 81, 82, and 84 are stacked in sequence on the insulation layer 56 and an embedded layer 72.

Conductors 66 are embedded in the insulation layers 55 and 56 and the insulation films 81 and 82. Front ends of the conductors 66 are in contact with the semiconductors 61. Wires 83 are embedded in the insulation film 82. Conductors 67 and 89 are embedded in the insulation film 84. The conductors 67 are connected to the conductors 66. The conductors 89 are connected to the wires 83.

A bit line 85 is provided on the insulation film 84. The bit line 85 is cut in a column direction x. The bit line 85 is connected to the conductors 67. An insulation layer 92 is provided in the bit line 85. The width and spacing of the bit line 85 can be set to a range of 10 to 40 nm, for example.

An etch stopper film 86 is provided on the bit line 85 and the insulation layer 92. An insulation layer 87 is provided on the etch stopper film 86. Conductors 90 are embedded in the etch stopper film 86 and the insulation layer 87. The conductors 90 are connected to the bit line 85. A wire 88 and vias 91 are provided on the insulation layer 87. The wire 88 is connected to the conductors 90.

The NIL process described above can be used for formation of the holes in which the conductors 67 are embedded and formation of the bit line 85. Accordingly, it is possible to reduce variations in the diameter of the holes in which the conductors 67 are embedded and variations in the line width of the bit line 85 while achieving cost reduction as compared to the method using photolithography.

While certain embodiments have been described, the embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A pattern formation method comprising:
forming a first imprint pattern for a prepared sample;
measuring residual film thickness distribution of the first imprint pattern;
calculating change rate of the residual film thickness of the first imprint pattern with respect to drop density of a resist material at the time of formation of the first imprint pattern;
forming a first etching pattern using the first imprint pattern as a mask;
measuring dimension distribution of the first etching pattern;

calculating a correction coefficient based on the residual film thickness distribution of the first imprint pattern and the dimension distribution of the first etching pattern;

correcting the residual film thickness of the first imprint pattern based on the correction coefficient to reduce a variation in size of the first etching pattern;

calculating a first drop density of an imprint material based on the change rate of the residual film thickness of the first imprint pattern with respect to drop density to obtain the corrected residual film thickness;

dropping the imprint material onto an etching material based on the first drop density;

pressing a template against the dropped imprint material to form the second imprint pattern with the corrected residual film thickness on the etching material;

etching the etching material using the second imprint pattern as a mask to form a second etching pattern;

determining whether dimension distribution of the second etching pattern falls within a specification;

calculating, when the dimension distribution of the second etching pattern does not fall within the specification, an additional residual film thickness to compensate for insufficient adjustment of the dimension of the second etching pattern; and calculating a second drop density of the imprint material to obtain the additional residual film thickness.

2. The method according to claim 1, wherein, in the correcting of the residual film thickness of the first imprint pattern, when there are a first region and a second region in which the first etching pattern is formed using the first imprint pattern as a mask and the dimension of the first etching pattern in the first region is smaller than the dimension of the first etching pattern in the second region, the residual film thickness of the second imprint pattern in the first region is made larger than the residual thickness of the first imprint pattern in the first region.

3. The method according to claim 2, wherein there is a level difference between the first region and the second region.

4. The method according to claim 2, wherein
the first region is a cell region in which a memory cell is arranged, and
the second region is a peripheral region in which a row decoder or a sense amplifier is arranged to operate the memory cell.

5. The method according to claim 1, wherein the residual film thickness is corrected for each of shot regions at a time of imprinting.

6. The method according to claim 1, wherein, in the calculating of the first drop density of the imprint material, when there are a first region and a second region in which the first etching pattern is formed using the first imprint pattern as a mask and the dimension of the first etching pattern in the first region is smaller than the dimension of the first etching pattern in the second region, the first drop density in the first region is made higher than the drop density of the resist material at the time of the formation of the first imprint pattern in the first region.

7. An imprint device comprising:
a stage to hold a wafer;
a drop unit to drop an imprint material onto the wafer;
a press unit to press a template against the imprint material dropped onto the wafer; and
a control unit to control drop position of the imprint material, wherein
the control unit
controls formation of a first imprint pattern for a prepared sample, calculates change rate of residual film thickness of the first imprint pattern with respect to drop density of a resist material at the time of the formation of the first imprint pattern, calculates a correction coefficient based on residual film thickness distribution of the first imprint pattern and dimension distribution of a first etching pattern that is formed using the first imprint pattern as a mask, corrects the residual film thickness of the first imprint pattern based on the correction coefficient to reduce a variation in size of the first etching pattern, calculates a first drop density of an imprint material based on the change rate of the residual film thickness of the first imprint pattern with respect to the drop density to obtain the corrected residual film thickness, controls the drop unit to drop the imprint material onto an etching material based on the first drop density, controls the press unit to press the template against the dropped imprint material to form the second imprint pattern with the corrected residual film thickness on the etching material, determines whether dimension distribution of a second etching pattern falls within a specification, the second etching pattern being formed by etching the etching material using the second imprint pattern as a mask, calculates, when the dimension distribution of the second etching pattern does not fall within the specification, an additional residual film thickness to compensate for insufficient adjustment of the dimension of the second etching pattern, calculates a second drop density of the imprint material to obtain the additional residual film thickness, and controls the drop unit to adjust a drop position of the imprint material depending on the second drop density.

8. The device according to claim 7, wherein, when there are a first region and a second region in which the first etching pattern is formed using the first imprint pattern as a mask and the dimension of the first etching pattern in the first region is smaller than the dimension of the first etching pattern in the second region, the control unit controls the drop unit to adjust the drop position of the imprint material such that the residual film thickness of the second imprint pattern in the first region is made larger than the residual thickness of the first imprint pattern in the first region.

9. The device according to claim 7, wherein the control unit corrects the residual film thickness for each of shot regions at a time of imprinting.

10. The device according to claim 7, wherein, when there are a first region and a second region in which the first etching pattern is formed using the first imprint pattern as a mask and the dimension of the first etching pattern in the first region is smaller than the dimension of the first etching pattern in the second region, the control unit controls the drop unit to adjust the drop position of the imprint material such that the first drop density in the first region is made higher than the drop density of the resist material at the time of the formation of the first imprint pattern in the first region.

11. A computer-readable non-volatile recording medium storing a drop recipe adjustment program that causes a computer to execute:
calculating change rate of residual film thickness of a first imprint pattern with respect to drop density of a resist material at the time of formation of the first imprint pattern for a prepared sample;
calculating a correction coefficient based on residual film thickness distribution of the first imprint pattern and dimension distribution of a first etching pattern that is formed using the first imprint pattern as a mask;
correcting the residual film thickness of the first imprint pattern based on the correction coefficient to reduce a variation in size of the first etching pattern;
calculating a first drop density of an imprint material based on the change rate of the residual film thickness of the first imprint pattern with respect to the drop density to obtain the corrected residual film thickness;
controlling drops of the imprint material onto an etching material based on the first drop density;
determining whether dimension distribution of a second etching pattern falls within a specification, the second etching pattern being formed by etching the etching material using a second imprint pattern as a mask, the second imprint pattern having the corrected residual film thickness and being formed on the etching material by pressing the template against the dropped imprint material;
calculating, when the dimension distribution of the second etching pattern does not fall within the specification, an additional residual film thickness to compensate for insufficient adjustment of the dimension of the second etching pattern; and
calculating a second drop density of the imprint material to obtain the additional residual film thickness.

12. The medium according to claim 11, wherein, in the correcting of the residual film thickness of the first imprint pattern, when there are a first region and a second region in which the first etching pattern is formed using the first imprint pattern as a mask and the dimension of the first etching pattern in the first region is smaller than the dimension of the first etching pattern in the second region, the residual film thickness of the second imprint pattern in the first region is made larger than the residual thickness of the first imprint pattern in the first region.

13. The medium according to claim 11, wherein the residual film thickness is corrected for each of shot regions at a time of imprinting.

14. The medium according to claim 11, wherein, in the calculating of the first drop density of the imprint material, when there are a first region and a second region in which the first etching pattern is formed using the first imprint pattern as a mask and the dimension of the first etching pattern in the first region is smaller than the dimension of the first etching pattern in the second region, the first drop density in the first region is made higher than the drop density of the resist material at the time of the formation of the first imprint pattern in the first region.

* * * * *